United States Patent
Nanai et al.

(10) Patent No.: US 7,858,968 B2
(45) Date of Patent: Dec. 28, 2010

(54) FIELD EFFECT TRANSISTOR AND METHOD OF FABRICATING THE SAME

(75) Inventors: Norishige Nanai, Hirakata (JP); Naohide Wakita, Osaka (JP); Takayuki Takeuchi, Ibaraki (JP)

(73) Assignee: Panasonic Corporation, Osaka (JP)

( * ) Notice: Subject to any disclaimer, the term of this patent is extended or adjusted under 35 U.S.C. 154(b) by 1025 days.

(21) Appl. No.: 10/564,755

(22) PCT Filed: Jul. 13, 2004

(86) PCT No.: PCT/JP2004/010275

§ 371 (c)(1),
(2), (4) Date: Jan. 8, 2007

(87) PCT Pub. No.: WO2005/008784

PCT Pub. Date: Jan. 27, 2005

(65) Prior Publication Data
US 2007/0108480 A1  May 17, 2007

(30) Foreign Application Priority Data
Jul. 17, 2003 (JP) .............................. 2003-275896
Sep. 10, 2003 (JP) .............................. 2003-318010

(51) Int. Cl.
*H01L 35/24* (2006.01)
*H01L 51/00* (2006.01)
*H01L 29/04* (2006.01)
*H01L 31/036* (2006.01)

(52) U.S. Cl. .......................................... 257/40; 257/72
(58) Field of Classification Search .................. 257/40, 257/72, E39.007; 977/847, 932
See application file for complete search history.

(56) References Cited

U.S. PATENT DOCUMENTS

| 6,794,220 B2 * | 9/2004 | Hirai et al. ..................... 438/99 |
| 7,282,742 B2 * | 10/2007 | Tsukamoto et al. ........... 257/88 |
| 2003/0096104 A1 | 5/2003 | Tobita et al. |

FOREIGN PATENT DOCUMENTS

| JP | 6-273881 | 9/1994 |
| JP | 2002-82082 | 3/2002 |
| JP | 2002-273741 | 9/2002 |
| JP | 2002-314093 | 10/2002 |
| JP | 2003-096313 | 4/2003 |
| WO | WO 02/080195 A1 | 10/2002 |

(Continued)

OTHER PUBLICATIONS

Avouris, "Carbon nanotube electronics," Chemical Physics, 2002, pp. 429-445, 281, Elsevier Science B.V.

(Continued)

*Primary Examiner*—Cuong Q Nguyen
(74) *Attorney, Agent, or Firm*—McDermott Will & Emery LLP

(57) ABSTRACT

A field effect transistor according to the present invention has a semiconductor layer through which carriers injected from a source region travel toward a drain region, the semiconductor layer being formed from a composite material including an organic semiconductor material and nanotubes. The nanotubes may be nanotubes including plural ones joined with each other.

13 Claims, 15 Drawing Sheets

FOREIGN PATENT DOCUMENTS

WO  WO 03/016599 A1  2/2003

OTHER PUBLICATIONS

Rosenblatt, et al., "High Performance Electrolyte Gated Carbon Nanotube Transistors," Nano Letters, 2002, pp. 869-872, vol. 2, No. 8, American Chemical Society.

Kawase, et al., "Polymer Semiconductor Active-Matrix Backplane Fabricated by Ink-Jet Technique," IDW, 2002, pp. 219-222, AMD2/EP1-1.

Japanese Office Action issued in Japanese Patent Application No. JP 2005-511874 dated Sep. 29, 2009.

* cited by examiner

FIELD EFFECT TRANSISTOR AND METHOD OF FABRICATING THE SAME

This application is the U.S. National Phase under 35 U.S.C. §371 of International Application No. PCT/JP2004/010275, filed Jul. 13, 2004, which in turn claims the benefit of Japanese Application No. 2003-275896, filed Jul. 17, 2003, and Japanese Application No. 2003-318010, filed Sep. 10, 2003, the disclosures of which Applications are incorporated by reference herein in their entirety.

TECHNICAL FIELD

The present invention relates to a field effect transistor and a method of fabricating the same and, more particularly, to a thin film transistor and a method of fabricating the same.

BACKGROUND ART

Presently, field effect thin film transistors (hereinafter will be referred to as TFTs as the case may be) are being suitably used as driving devices for use in flat panel displays and the like. Though various TFT configurations have been proposed, TFTs generally have a basic configuration wherein current passing between source and drain electrodes in contact with a semiconductor layer is controlled by means of voltage applied to a gate electrode formed on the semiconductor layer via an insulating layer (that is, by means of an electric field generated by the applied voltage). Usually, such a TFT is fabricated using a thin film control process by which layers on a substrate are processed and formed under precise control. Such TFTs call for excellent electrical characteristics and highly reliable stability. In TFTs that have been put to practical use, the semiconductor layer comprises amorphous silicon (a-Si:H) or low-temperature formed polysilicon and the gate insulator comprises silicon oxide or silicon nitride. Because various materials and processing methods for forming an active-matrix liquid crystal display (AMLCD) based on an amorphous silicon (a-Si:H) or low-temperature formed polysilicon device require many fabrication process steps at high temperatures, a large number of substrate materials that are otherwise useful cannot be employed.

With the progress of the flat panel display technology, a request has arisen that the substrate have a lighter weight, mechanical flexibility and impact resistance, along with a request for resources saving. Also, demands exist for realization of sheet-like or paper-like displays or portable equipment and the like. However, plastic sheets or resin films for AMLCDs which are useful to meet such demands or requests are difficult to use in fabrication process steps at temperatures of from 150° to 250° or higher.

In recent years, organic semiconductor TFTs have been under research which utilizes an organic semiconductor comprising an organic material base having semiconductor properties instead of the aforementioned semiconductors such as amorphous silicon and low-temperature formed polysilicon. The use of such an organic material allows these devices to be fabricated without the need to prepare highly costly equipment that is needed for the silicon-using process. Such a device is improved in mechanical flexibility and can be fabricated by a process at room temperature or a low temperature close to room temperature. Thus, a flexible plastic substrate or resin film can be used as a substrate for use in a sheet-like or paper-like display or a like device.

In a conventionally known TFT having a semiconductor layer comprising such a low-molecular-weight organic semiconductor material as pentacene, the organic semiconductor layer has a single-crystalline or polycrystalline phase. Such a TFT is lower in carrier mobility than a TFT having a silicon-type semiconductor layer and can obtain a carrier mobility value as low as about 0.1-0.6 $cm^2/Vs$. If the organic semiconductor layer has increased grain boundary or lowered crystallinity, the organic semiconductor layer has further lowered carrier mobility and hence cannot be used as a TFT.

Such a polymer-type organic semiconductor material as a thiophene material can also be used. However, such a material is low in carrier mobility since the material is amorphous (see, for example, Takeo Kawase and two others, IDW '02, AMD2/EP1-1, pp. 219-222, Polymer Semiconductor Active-Matrix Backplane Fabricated by Ink-Jet Technique" (non-patent document 1)). According to non-patent document 1, a TFT having a semiconductor layer comprising a fluorene-bithiophene copolymer exhibits a value of carrier mobility as low as 0.003-0.005 $cm^2/Vs$ at channel.

A TFT having a semiconductor layer exhibiting such a low carrier mobility as taught by non-patent document 1 is not practical because the TFT usually needs to have an extremely large gate width of about several hundred μm. Also, with such a polymer-type organic semiconductor having a low carrier mobility, the spacing between the source electrode and the drain electrode need be very short, which requires extremely fine microfabrication. This is not practical. A TFT having a semiconductor layer comprising only such a polymer-type organic semiconductor as a thiophene material has a low carrier mobility at channel and low on-conductivity though exhibiting high off-resistance and high peel strength between the semiconductor layer and an insulating layer.

In contrast, a TFT having a semiconductor layer comprising carbon nanotube, which has a nanostructure, is under study recently, is formed from carbon, exhibits very good electric conductivity and has tough characteristics, has obtained a value of carrier mobility as high as about 1000-1500 $cm^2/Vs$ (see, for example, Sami Rosenblatt and five others, Nano Lett. 2, pp. 869-872 (2002), "High Performance Electrolyte Gated Carbon Nanotube Transistors" (non-patent document 2). Also, a report has been made of a TFT structure having a semiconductor layer comprising semiconductor-type carbon nanotube that is considered to have such a high value of carrier mobility as mentioned in non-patent document 2 and a fabrication method thereof (see, for example, Phaedon Avouris, Chem. Phys. 281, pp. 429-445 (2002), FIG. 6, "Carbon nanotube electronics" (non-patent document 3).

FIG. 15 is a sectional view schematically showing the construction of a conventional TFT having a semiconductor layer comprising carbon nanotubes. According to non-patent document 3, TFT 60 as shown in FIG. 15 includes a 150 nm-thick gate insulator 62 comprising thermally oxidized silicon formed on a $p^+$-silicon substrate 61 which serves also as a gate electrode, and a 1.4 nm-thick semiconductor layer 63 formed by dispersing semiconductor-type carbon nanotubes of 1.4 nm diameter on the gate insulator 62 at an appropriate dispersion density. Further, a metal such as titanium (Ti) or cobalt (Co) is deposited on the semiconductor layer 63 by evaporation to form source electrode 64 and drain electrode 65 on opposite sides of contact portions 66 and 67 in contact with the carbon nanotubes, thus forming a TFT having low junction resistance and a good transconductance characteristic.

Such a TFT having a semiconductor layer comprising only nanotubes has high carrier mobility at channel and high on-conductivity but suffers from poor peel strength due to the semiconductor layer 63 formed by merely placing the nanotubes on the gate insulator 62 and is difficult to fabricate.

In the step of forming a 1.4 nm-thick semiconductor layer by dispersing nanotubes, such as carbon nanotubes, of 1.4 nm-diameter at an appropriate dispersion density as in non-patent document 3, it is actually difficult to increase the nanotube dispersion density and keep the increased density constant. Further, the process of arranging multiple nanotubes of nanostructure side by side without overlapping them each other is an unstable factor which raises a problem of large variations in TFT electrical characteristics.

DISCLOSURE OF INVENTION

The present invention has been made in view of the foregoing problems. A first object of the present invention is to provide a field effect transistor which is excellent in mechanical flexibility and impact resistance and high in carrier mobility, particularly, a TFT which does not need any highly miniaturized structure and is subject to less variations in electrical characteristics and a method of fabricating the TFT.

A second object of the present invention is to provide an active-matrix display incorporating a plurality of such field effect transistors, and a wireless ID tag and portable equipment each using such a field effect transistor in an integrated circuit section thereof.

In order to attain these objects, a field effect transistor according to the present invention comprises a semiconductor layer through which carriers injected from a source region travel toward a drain region, the semiconductor layer being formed from a composite material comprising an organic semiconductor material and nanotubes. In the present description, the source region and drain region is a concept including a source electrode and a drain electrode as well as a contact layer or a heavily impurity-doped region or the like connecting the source electrode and drain electrode to the semiconductor layer.

The semiconductor layer is meant to include a structure in which the nanotubes are circumferentially coated with the organic semiconductor material.

In the semiconductor layer, plural ones of the nanotubes may be joined with each other. For example, plural ones of the nanotubes may be joined with each other by chemical bond. In this case a joint between the joined nanotubes is preferably coated with the organic semiconductor material.

Preferably, the nanotubes are carbon nanotubes.

Preferably, the organic semiconductor material is a polymer-type organic semiconductor material comprising a thiophene material for example.

Alternatively, the organic semiconductor material is preferably a low-molecular-weight organic semiconductor material comprising an acene-type material for example.

Preferably, the nanotubes are substantially oriented in a predetermined direction in the semiconductor layer.

Preferably, the field effect transistor is a TFT.

Preferably, the field effect transistor is formed on a substrate. The substrate may be formed from a plastic sheet or a resin film for example.

The present invention also provides a method of fabricating a field effect transistor having a semiconductor layer through which carriers injected from a source region travel toward a drain region, the method comprising the steps of: (a) providing a composite material comprising an organic semiconductor material and nanotubes; and (b) forming the semiconductor layer with use of the composite material.

For example, the step (a) includes a process of preparing the composite material by mixing the organic semiconductor material with the nanotubes.

For example, the composite material is prepared by mixing the nanotubes with a solution of the organic semiconductor material to prepare the composite material in the step (a) and the semiconductor layer is formed by drying the composite material in the step (b).

For example, the composite material is prepared to comprise the nanotubes coated with the organic semiconductor material in the step (a). It is possible to employ a method of preparing the composite material which includes repeating a process including immersing the nanotubes into the solution of the organic semiconductor material and filtering the resulting mixture.

Preferably, the nanotubes are carbon nanotubes.

The nanotubes used in the step (a) may include plural ones joined with each other. In this case, for example, the method further includes, prior to the step (a), the step (c) of joining the plural ones of the nanotubes with each other. In the step (c), the plural ones of the nanotubes may be joined with each other by chemical bond for example.

An active-matrix display according to the present invention comprises a plurality of field effect transistors as recited in any one of claims 1 to 15 which are disposed as switching devices for driving pixels.

A wireless ID tag according to the present invention comprises a field effect transistor as recited in any one of claims 1 to 15 which is used as a semiconductor device for forming an integrated circuit.

Portable equipment according to the present invention comprises a field effect transistor as recited in any one of claims 1 to 15 which is used as a semiconductor device for forming an integrated circuit.

These and other objects, features and advantages of the present invention will become apparent from the following detailed description of the preferred embodiments with reference to the accompanying drawings.

BEST MODE FOR CARRYING OUT THE INVENTION

Hereinafter, embodiments of the present invention will be described with reference to the drawings. Like numerals designate like elements throughout the views to be described below.

First Embodiment

The first embodiment is directed to a TFT having a semiconductor layer formed from a composite material comprising an organic semiconductor material and nanotubes.

Figure 1:
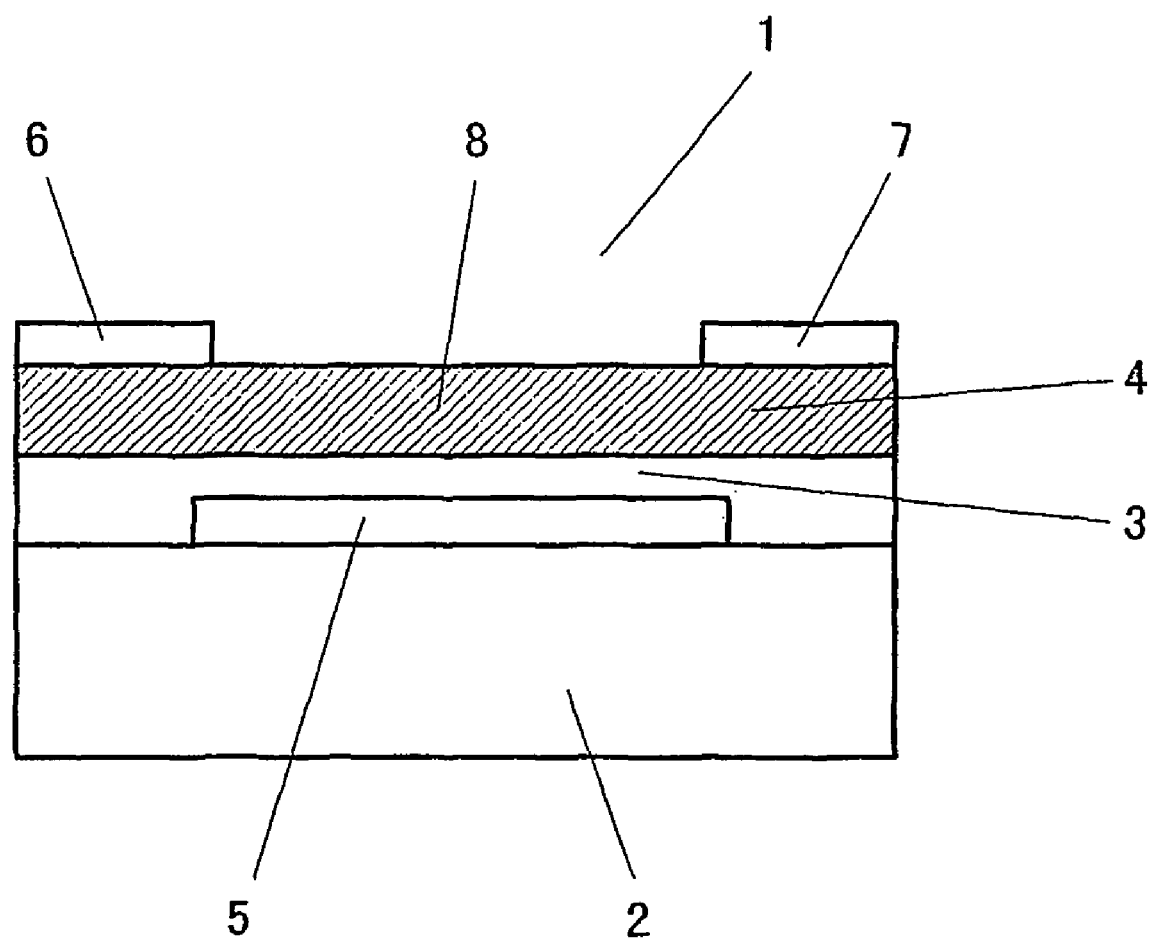
FIG. 1 is a sectional view schematically showing the construction of a TFT according to a first embodiment.

FIG. 1 is a sectional view schematically showing the construction of the TFT according to this embodiment. As shown in FIG. 1, the TFT 1 has, on a substrate 2, a gate electrode 5, a gate insulator 3, a semiconductor layer 4, a source electrode 6, and a drain electrode 7. Specifically, the gate electrode 5 is provided on a major surface of the substrate 2 and the gate insulator 3 is formed to cover the gate electrode 5. Further, the semiconductor layer 4 is provided on the gate insulator 3, while the source electrode 6 and the drain electrode 7 disposed separately from each other on the semiconductor layer 4. In a plan view, the gate electrode 5 is located intermediate the source electrode 6 and the drain electrode 7. With this construction, the gate electrode 5 is isolated from channel 8 to be electrically formed in the semiconductor layer 4 by the gate insulator 3.

The semiconductor layer 4 is formed using a composite material comprising a polymer-type organic semiconductor material and carbon nanotubes. In the present embodiment, the composite material is composed of a polymer-type organic semiconductor material comprising a fluorene-bithiophene copolymer, and mixed-type carbon nanotubes including, as mixed, semiconductor-type nanotubes and metal-type nanotubes, which mixed-type carbon nanotubes are usually obtained in the preparation of carbon nanotubes.

Figure 2:
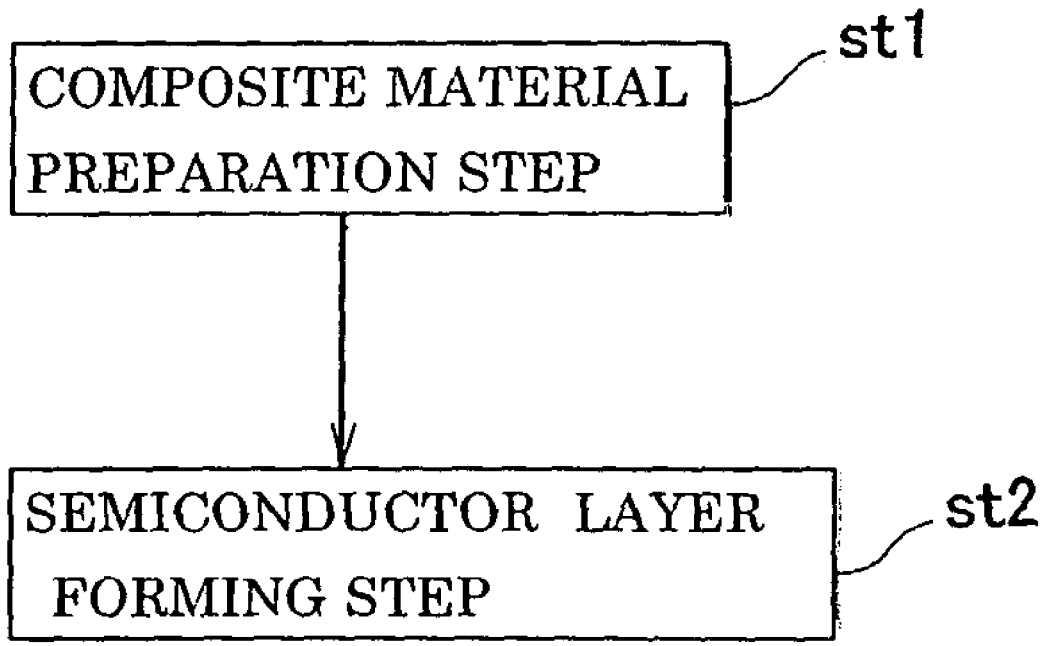
FIG. 2 is a flowchart of a method of forming a semiconductor layer.

Description will be made of a method of fabricating the TFT 1 according to the present embodiment. FIG. 2 is a flowchart of a method of forming the semiconductor layer 4. As shown in FIG. 2, the method includes a composite material preparation step (St1) in which the composite material comprising a mixture of the polymer-type organic semiconductor material comprising the fluorene-bithiophene copolymer and the aforementioned mixed-type carbon nanotube material is prepared previously, and a semiconductor layer forming step (St2) in which the semiconductor layer 4 is formed on the gate insulator 3 with use of the composite material thus prepared.

In the composite material preparation step, desirably, the organic semiconductor material and the nanotubes are mixed together at an adjusted mixture ratio. Adjustment of the mixture ratio enables the carrier mobility of the TFT 1 to be regulated. The mixture ratio of the nanotubes to the whole mixture is suitably about 30 to 90% by volume. If the volume ratio of the nanotubes is less than 30%, it is difficult for the semiconductor layer 4 to obtain a sufficient conductivity. If the volume ratio of the nanotubes is more than 90%, a sufficient binding action is difficult to result and, hence, stabilized formation of the semiconductor layer 4 is difficult. More preferably, the volume ratio of the nanotubes is about 50 to 70%. The composite material preparation step may include an additional step or use an additional material for the purpose of allowing the composite material preparation step and the semiconductor layer forming step to proceed smoothly.

Though the composite material is prepared in the composite material preparation step (St1) according to the above description, the composite material preparation step (St1) may be replaced with the step of providing the composite material that has already been prepared.

Since the semiconductor layer 4 of the TFT 1 is formed using the composite material, the step of dispersing and arranging multiple nanotubes to form the semiconductor layer can be eliminated, whereby TFTs having excellent characteristics can be fabricated easily and stably.

Next, description will be made of the fabrication method of the whole TFT 1. First, in order to form the gate electrode 5 on the substrate 2, a predetermined electrode material is subjected to printing using a screen sheet previously patterned to obtain a desired shape, followed by sufficient drying. This step forms the gate electrode 5 of the desired shape on the substrate 2.

Subsequently, in order to form the gate insulator 3, a predetermined insulating material is subjected to printing over the substrate 2 and gate electrode 5 using a screen sheet previously patterned, followed by sufficient drying. This step forms the gate insulator 3 over the substrate 2 and gate electrode 5.

Subsequently, the semiconductor layer 4 is formed over the gate insulator 3 by the above-described semiconductor layer forming step. Specifically, the composite material, which has been previously prepared to comprise the organic semiconductor material and the nanotubes in the composite material preparation step, is applied to the gate insulator 3 to form the semiconductor layer 4.

Finally, a predetermined electrode material is deposited on the semiconductor layer 4 by evaporation to form the source electrode 6 and the drain electrode 7.

Figure 3:
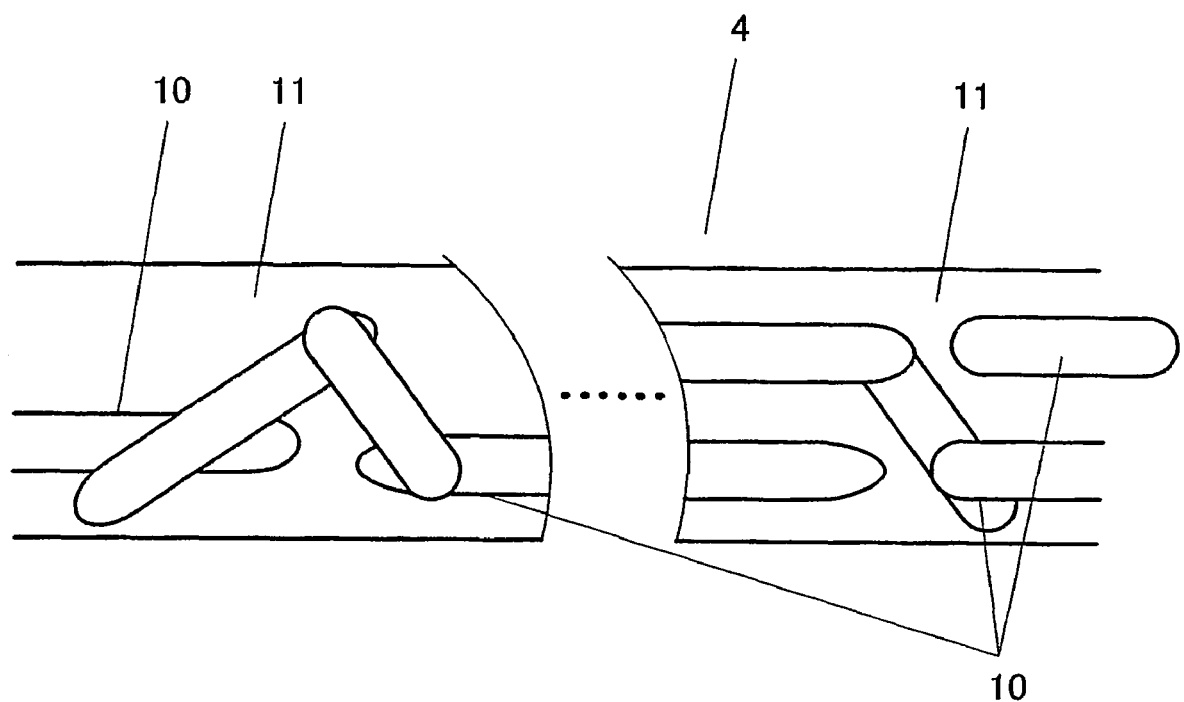
FIG. 3 is a top plan view conceptually illustrating the relationship between an organic semiconductor material and nanotubes in a semiconductor layer of the TFT according to the first embodiment.

FIG. 3 is a top plan view conceptually illustrating the relationship between the organic semiconductor material and the nanotubes in the semiconductor layer 4 of the TFT 1 according to the present embodiment. As shown in FIG. 3, in the semiconductor layer 4, the mixed-type carbon nanotubes 10, which include, as mixed, semiconductor-type carbon nanotubes and metal-type carbon nanotubes, are circumferentially coated one by one with the polymer-type organic semiconductor material 1 comprising the flexible fluorene-bithiophene copolymer. That is, the semiconductor layer 4 has the carbon nanotubes 10 mixed and dispersed in the organic semiconductor material 11. The carrier mobility at channel of the TFT 1 of this embodiment is 110 cm$^2$/Vs, which is a largely improved value as compared with the value of carrier mobility of a TFT having semiconductor layer 4 comprising only the organic semiconductor material.

When the TFT 1 is on, current in the semiconductor layer 4 passes through the mixed-type carbon nanotubes 10 and through the polymer-type organic semiconductor material 11 covering the circumferences of nanotubes 10 closely spaced a short distance from each other. Therefore, the TFT 1 according to the present embodiment is largely improved in carrier mobility and on-characteristics as compared with the TFT having the semiconductor layer comprising only the polymer-type organic semiconductor layer. When the TFT 1 is off, the carbon nanotubes 10 do not directly contact each other since they are individually coated with the organic semiconductor material 11 circumferentially. For this reason, the TFT 1 is superior in off-characteristics to a TFT having a semiconductor layer comprising only nanotubes. Because a portion of the organic semiconductor material 11 that is present on a contact portion of each carbon nanotube 10 serves substantially as a switch portion in a circuit, the TFT 1 is given a miniaturized structure without the need to form an extremely fine pattern on the substrate with difficulty. Accordingly, the TFT 1 can be fabricated easily and is subject to less variation in characteristics.

As described above, the characteristics of the TFT 1 according to the present embodiment in both the on-state and the off-state assume intermediate values between the values of the characteristics of the TFT having the semiconductor layer comprising only the organic semiconductor material and the values of the characteristics of the TFT having the semiconductor layer comprising only the nanotube material. For this reason, if a TFT has insufficient characteristics in one of the on-state and the off-state, improvement can be made by the present embodiment. For example, the TFT having the semiconductor layer comprising only the organic semiconductor material having a low carrier mobility needs to have a gate width of about several hundred μm, while the TFT having the semiconductor layer comprising only the nanotube material having a very high carrier mobility needs to have a very small gate width of about 0.1 μm. Either case is not practical. In contrast, the carrier mobility of the TFT 1 according to the present embodiment assumes an intermediate value between the values of carrier mobility of the two, which allows designing and fabrication to be made based on a practical gate width of about several μm and makes it possible to use a long and wide channel region. For this reason, the channel shape can be designed to meet the conductivities in the on-state and the off-state with an increased degree of freedom.

Further, since the semiconductor layer 4 of the TFT 1 according to the present embodiment is formed using the composite material comprising a mixture of the polymer-type organic semiconductor material which can form flexible semiconductor layer 4 and the nanotubes, the TFT 1 is further improved in mechanical strength such as peel strength as compared with the TFT having the semiconductor layer comprising only the nanotube material while exhibiting improved chemical stability and heat resistance as compared with the TFT having the semiconductor layer comprising only the organic semiconductor material. Thus, the TFT 1 can be easy to fabricate and use.

In the TFT 1 fabrication process, the semiconductor layer 4 may be imparted with orientation by subjecting the surface of the gate insulator 3 to an orientation treatment prior to the formation of the semiconductor layer 4. Usable orientation treatments include methods well known to those skilled in the art such as rubbing used in the liquid crystal technology. Such orientation treatments enable the organic semiconductor material 11 to be oriented and allow the carbon nanotubes 10 to align in a direction suitably within the semiconductor layer 4, thereby making it possible to improve the characteristics of the TFT 1.

In the TFT 1 fabrication process, the composite material preparation step may be the step of preparing the composite material by repeating a process including immersing the nanotubes into a solution of the polymer-type organic semiconductor material and filtering the resulting mixture. Such a process can prepare the composite material from which excess solution has been substantially removed and in which the nanotubes are each circumferentially coated more suitably. By the use of such a composite material, it is possible to form the semiconductor layer 4 comprising the composite material easily.

In the composite material preparation step, the composite material may be prepared by spraying a solution of the polymer-type organic semiconductor material containing nanotubes dispersed therein and then drying the solution. This process can prepare the composite material in powdery form comprising the nanotubes circumferentially coated with the organic semiconductor material. By the use of such a composite material, it is possible to form the semiconductor layer 4 comprising the composite material easily.

In the composite material preparation step, the composite material may be prepared into paste by introducing a large amount of nanotubes into a high concentration solution of the organic semiconductor material and then compounding the resulting mixture. In the semiconductor layer forming step, such composite material paste may be applied or subjected to printing and then dried to form the semiconductor layer. With such a composite material preparation step, it is possible to prepare the composite material in paste form in which the nanotubes are circumferentially coated with the organic semiconductor material. If such a composite material is applied or subjected to printing and then dried in the semiconductor layer forming step, the semiconductor layer can be formed easily.

The aforementioned substrate 2 comprises a plastic sheet formed from polycarbonate for example. Alternatively, it is possible to use other flexible and pliable plastic sheets and thin glass substrates as well as resin films of pliant nature such as thin polyimide films. By the use of such a substrate the TFT can be used in a paper display, a sheet display and the like.

Materials that can be used for the gate electrode 5, source electrode 6 and drain electrode 7 have electrical conductivity and fail to react with the substrate 2 and the semiconductor layer 4. Examples of such usable materials include doped silicon, noble metals such as gold, silver, platinum and palladium, alkali metals and alkali earth metals such as lithium, cesium, calcium and magnesium, and metals such as copper, nickel, aluminum, titanium and molybdenum, and alloys thereof. In addition, it is possible to use organic substances having conductivity such as polypyrrol, polythiophene, polyaniline and polyphenylenevinylene. The gate electrode 5, in particular, can operate even though having a higher electrical resistance than other electrodes 6 and 7. For this reason, the gate electrode 5 may be formed using a material different from the material of the source electrode 6 and drain electrode 7 in order to facilitate the fabrication. These electrodes can be formed using a room-temperature process in which such electrodes are formed by deposition at room temperature or a temperature close thereto.

The aforementioned gate insulator 3 may comprise any material that has an electric insulating property and fails to react with any one of the substrate 2, electrodes 5, 6 and 7 and semiconductor layer 4. Besides the above-exemplified materials, silicon can be used for the substrate 2. The gate insulator 3 may comprise an ordinary silicon oxide film formed on the substrate 2 comprising silicon. A thin layer comprising resin or the like formed after the formation of an oxide film can function as the gate insulator 3. The gate insulator 3 may be formed by depositing a compound consisting of elements different from those forming the substrate 2 and electrodes 5, 6 and 7 by CVD, evaporation or sputtering, or by application, spraying, electrodeposition or the like. Because it is known that a material having a high dielectric constant can be used for the gate insulator for the purpose of lowering the gate voltage, a compound having a high dielectric constant other than ferroelectric compounds and ferroelectrics may be used for the gate insulator. Besides such inorganic substances, it is possible to use organic substances that are high in dielectric constant, such as polyvinylidene fluoride type compounds or polyvinylidene cyanide type compounds.

While the present embodiment uses a thiophene-type copolymer as the polymer-type organic semiconductor material contained in the composite material, any other polymer-type organic material that has an appropriate value of carrier mobility can also be used similarly. Also, a low-molecular-weight organic semiconductor material may be used instead of the polymer-type organic semiconductor material. For example, acene-type materials that are high in carrier mobility can be preferably used. The use of the composite material containing such an organic semiconductor material can provide for a TFT having superior characteristics.

Though carbon nanotubes are used as the nanotubes, it will be possible in future that nanotubes formed from a material other than carbon is used.

In cases where a solution of a polymer-type organic semiconductor material having a liquid crystalline phase is used as the polymer-type organic semiconductor material, an orientation treatment allows polymer-type organic semiconductor molecules to be aligned and the nanotubes to be arranged more favorably. The polymer-type organic semiconductor material, per se, may be an organic semiconductor material comprising a liquid crystalline polymer. Such an organic semiconductor material can be used by being subjected to an orientation treatment and curing. If the organic semiconductor material comprising a liquid crystalline polymer is used, the semiconductor layer is further improved in orientation characteristic. By orienting the nanotubes, it is possible to fill the nanotubes without clearance therebetween adjacent ones, improve the dispersion density of the nanotubes and further improve the carrier mobility.

The TFT 1 according to the present embodiment is of the bottom-gated type having the gate electrode 5 formed on the substrate 2. However, the structure of the TFT 1 is not limited to that shown in FIG. 1. The TFT 1 may be, for example, of the top-gated type having the gate electrode formed on the gate insulator on the opposite side away from the substrate.

Second Embodiment

The second embodiment is directed to a TFT having a semiconductor layer formed from a composite material comprising an organic semiconductor material and nanotubes.

Figure 4:
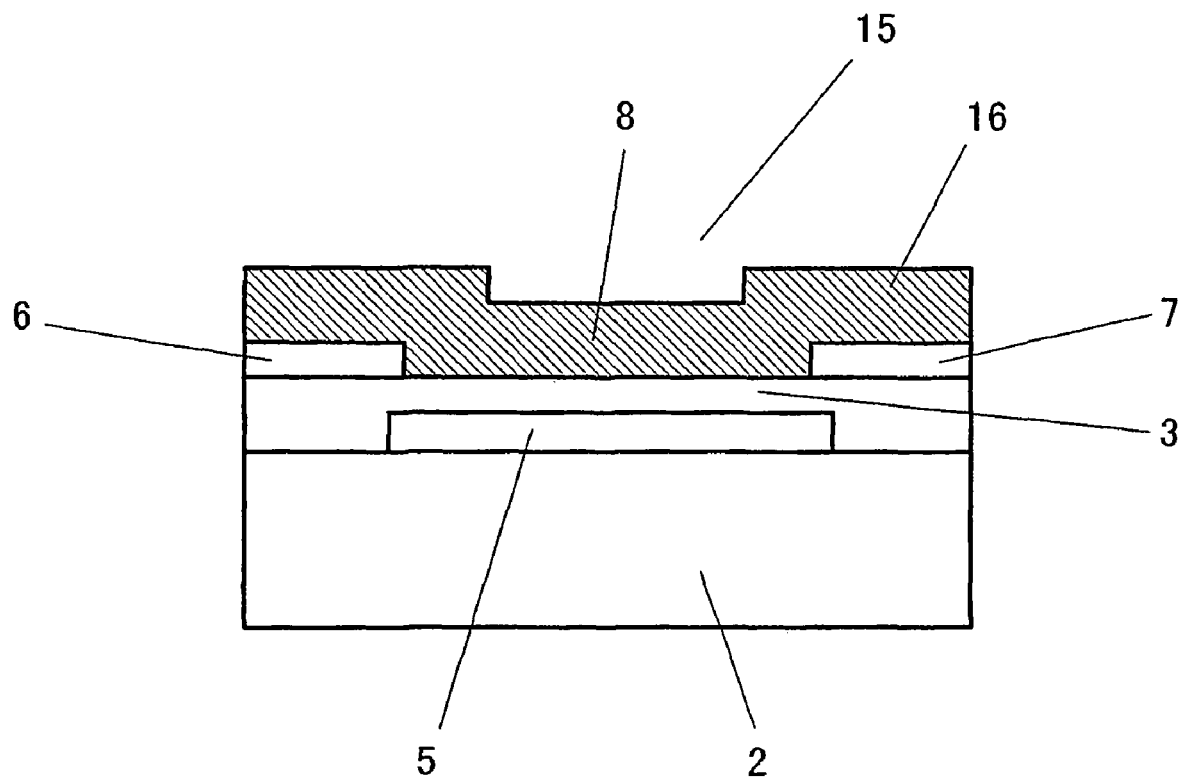
FIG. 4 is a sectional view schematically showing the construction of a TFT according to a second embodiment.

FIG. 4 is a sectional view schematically showing the construction of the TFT according to this embodiment. As shown in FIG. 4, the TFT 15 has, on a substrate 2, a gate electrode 5, a gate insulator 3, a source electrode 6, a drain electrode 7, and a semiconductor layer 16. Specifically, the gate electrode 5 is provided on a major surface of the substrate 2 and the gate insulator 3 formed to cover the gate electrode 5. The source electrode 6 and the drain electrode 7 are disposed separately from each other on the gate insulator 3, while the semiconductor layer 16 formed to cover the source electrode 6, drain electrode 7 and gate insulator 3. In a plan view, the gate electrode 5 is located intermediate the source electrode 6 and the drain electrode 7. With this construction, the gate electrode 5 is isolated from channel 8 to be electrically formed in the semiconductor layer 4 by the gate insulator 3.

The method of fabricating the TFT 15 according to the present embodiment is merely different from the method of fabricating the TFT 1 (see FIG. 1) according to the first embodiment in the stacked sequence of the components except the method of forming the semiconductor layer 16. For this reason, description will be omitted of other features than the method of forming the semiconductor layer 16.

In the present embodiment, the semiconductor layer 16 is formed using a composite material comprising a polymer-type organic semiconductor material and semiconductor-type carbon nanotubes. Specifically, the composite material is prepared by mixing a polymer-type organic semiconductor material comprising a fluorene-bithiophene copolymer with semiconductor-type carbon nanotubes screened from carbon nanotubes which are usually obtained as a mixture of semiconductor-type carbon nanotubes and metal-type carbon nanotubes.

The process steps for forming the semiconductor layer 16 are similar to the process steps according to the first embodiment illustrated in FIG. 2. The method of forming the semiconductor layer 16 includes a composite material preparation step (St1) in which a solution of the composite material obtained by immersing semiconductor-type carbon nanotubes into a solution of the aforementioned organic semiconductor material is prepared, and a semiconductor layer forming step (St2) in which the semiconductor layer 16 is formed by a process including applying the solution of the composite material to the gate insulator 3 or spraying the solution onto the gate insulator 3 by the ink-jet technique or a like technique and concentrating the solution to precipitate the semiconductor-type carbon nanotubes coated with the organic semiconductor material. Such steps allow multiple nanotubes to be dispersed and arranged without the need to provide such a difficult step as to disperse and arrange the nanotubes by adjusting the positions of the nanotubes one by one. Thus, the semiconductor layer 16 can be formed using such an easy and convenient process.

Figure 5:
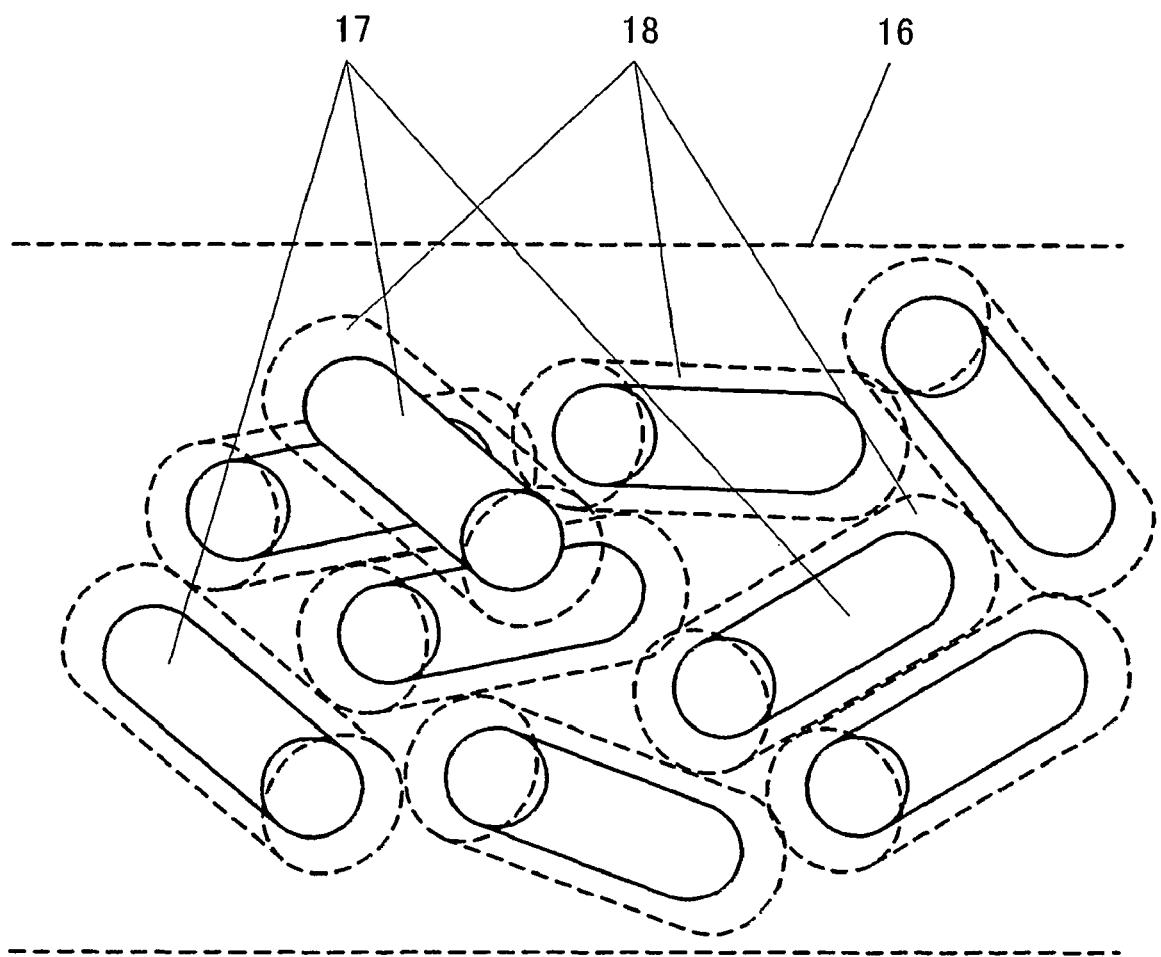
FIG. 5 is a top plan view conceptually illustrating the relationship between an organic semiconductor material and nanotubes in a semiconductor layer of the TFT according to the second embodiment.

FIG. 5 is a top plan view conceptually illustrating the relationship between the organic semiconductor material and the nanotubes in the semiconductor layer 16 of the TFT 15 according to the present embodiment. In the composite material preparation step, the semiconductor-type carbon nanotubes are immersed into the solution of the polymer-type organic semiconductor material, so that the semiconductor-type carbon nanotubes 17 are each circumferentially coated with the polymer-type organic semiconductor material 18 comprising the flexible fluorene-bithiophene copolymer. Subsequently, the solution of the organic semiconductor material comprising the mixture of the carbon nanotubes 17 and the polymer-type organic semiconductor material 18 is applied or sprayed onto the gate insulator 3 or the electrodes 6 and 7 in a desired region and then the solution thus applied or sprayed is concentrated to cause precipitation to proceed, whereby the semiconductor layer 16 is formed. That is, the semiconductor layer 16 is formed to comprise the semiconductor-type carbon nanotubes 17 piled up, each of which has a length of about 0.1 to several μm and a diameter of about 1 to several nm and is circumferentially coated with the flexible polymer-type organic semiconductor material 18. In this way, the polymer-type organic semiconductor material 18 can provide a smooth coat over the circumference of each carbon nanotube 17.

Here, TFT 15 was fabricated having semiconductor layer 16 comprising a thiophene polymer-type organic semiconductor material 18 having a low carrier mobility of about 0.003 to 0.01 $cm^2/Vs$, and semiconductor-type carbon nanotubes 17 having a high carrier mobility of about 1000 to 1500 $cm^2/Vs$. The carrier mobility at channel 8 of the TFT 15 was a high value of 170 $cm^2/Vs$. Thus, the TFT 15 obtained had a high carrier mobility and superior characteristics.

When the TFT 15 is on, current in the semiconductor layer 16 mostly passes through the semiconductor-type carbon nanotubes 17 and passes through the polymer-type organic semiconductor material 11 covering the circumferences of nanotubes 17 closely spaced a short distance from each other. Therefore, the TFT 15 is largely improved in carrier mobility and on-characteristics as compared with a TFT having a semiconductor layer comprising only the polymer-type organic semiconductor material.

When the TFT 15 is off, the TFT 15 is superior in off-characteristics to a TFT having semiconductor layer 16 comprising only nanotubes 17 since the semiconductor layer 16 of the TFT 15 is composed of individual nanotubes 17 and the polymer-type organic semiconductor material 18 coating the circumference of each nanotube 17. Also, since the semiconductor layer 16 can use a relatively long and wide channel region as compared with the TFT having semiconductor layer 16 comprising only nanotubes 17, the channel shape can be designed to meet the conductivities in the on-state and the off-state with an increased degree of freedom.

Further, since the semiconductor layer 16 is formed from the composite material comprising the polymer-type organic semiconductor material which can form a mechanically flexible film and the nanotubes, the TFT 15 is further improved in mechanical strength such as peel strength as compared with the TFT having the semiconductor layer comprising only the polymer-type organic semiconductor material or only the nanotube material while exhibiting improved chemical reliability and heat resistance reliability as compared with the TFT having the semiconductor layer comprising only the organic semiconductor material. Thus, the TFT 15 is easy to fabricate and use.

In the method of fabricating the TFT 15, it is possible that the composite material preparation step is the step of preparing the composite material in which the nanotubes are dispersed while the semiconductor layer forming step is the step of spraying and drying the composite material. Thus, the semiconductor layer can be formed easily by a process including: providing a solution of the composite semiconductor material in which the nanotubes are dispersed so as to be circumferentially coated with the organic semiconductor material in the composite material preparation step; and spraying the solution of the composite semiconductor material to a predetermined region on the substrate or spray-coating the region with the solution by such means as the ink-jet technique and then drying the solution.

Third Embodiment

The third embodiment is directed to a TFT having a semiconductor layer formed from a composite material comprising an organic semiconductor material and nanotubes.

Figure 6:
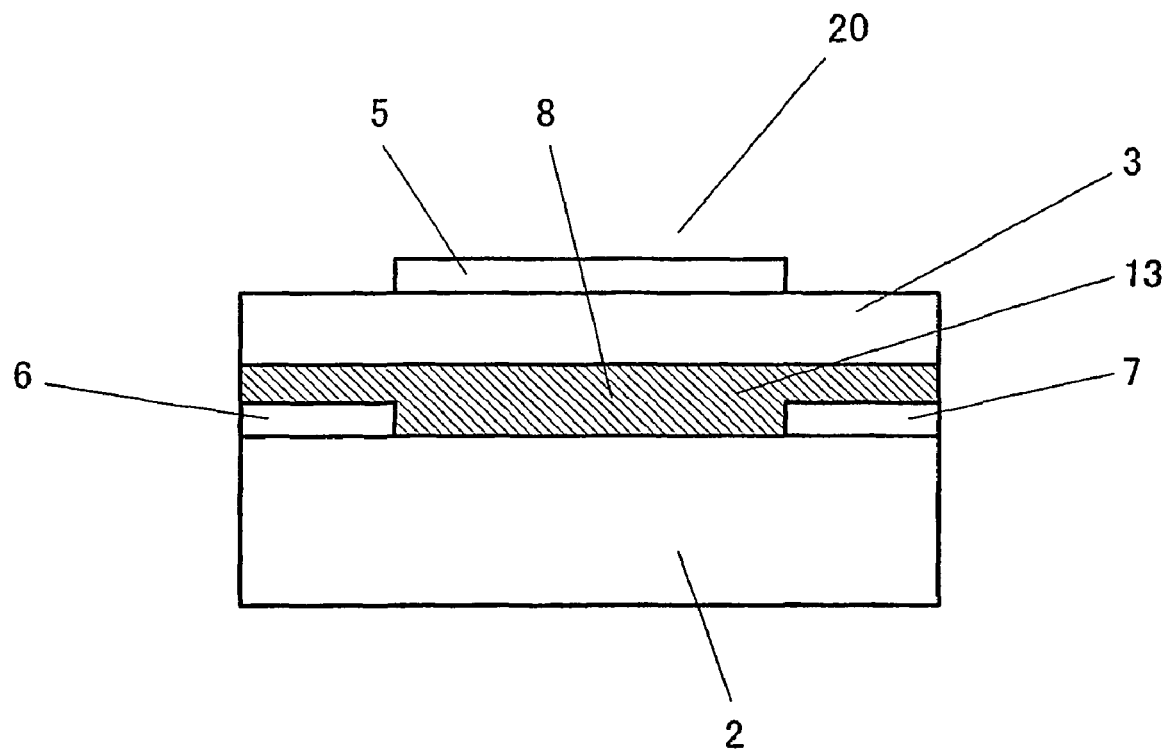
FIG. 6 is a sectional view schematically showing the construction of a TFT according to a third embodiment.

FIG. 6 is a sectional view schematically showing the construction of the TFT according to this embodiment. As shown in FIG. 6, the TFT 20 is a top-gated TFT having, on a substrate 2, a source electrode 6, a drain electrode 7, a semiconductor layer 13, a gate insulator 3, and a gate electrode 5. Specifically, the source electrode 6 and the drain electrode 7 are disposed separately from each other on a major surface of the substrate 2, while the semiconductor layer 13 formed to cover the source electrode 6, drain electrode 7 and substrate 2. The gate insulator 3 is provided over the semiconductor layer 13, while the gate electrode 5 provided on the gate insulator 3. In a plan view, the gate electrode 5 is located intermediate the source electrode 6 and the drain electrode 7. With this construction, the gate electrode 5 is isolated from channel to be electrically formed in the semiconductor layer 13 by the gate insulator 3.

The method of fabricating the TFT 20 according to the present embodiment is merely different from the method of fabricating the TFT 1 (see FIG. 1) according to the first embodiment in the stacked sequence of the components except the method of forming the semiconductor layer 13. For this reason, description will be omitted of other features than the method of forming the semiconductor layer 13.

The composite material used for forming the semiconductor layer 13 is the same as that used in the second embodiment. The method of forming the semiconductor layer 13 is similar to that used in the second embodiment except the feature that the nanotubes 17 are oriented. Specifically, the semiconductor layer 13 is formed in a semiconductor layer forming step which includes: subjecting an orientation film, such as a polyimide film or a monomolecular film, formed on the surface of the substrate 2 at least in a region coincident with a portion in which channel 8 is to be formed to a treatment for orientation in a predetermined direction such as rubbing; applying or spraying a solution of the composite material onto the gate insulator 3; and concentrating the solution to precipitate the semiconductor-type carbon nanotubes 17 coated with the organic semiconductor material.

Figure 7A:
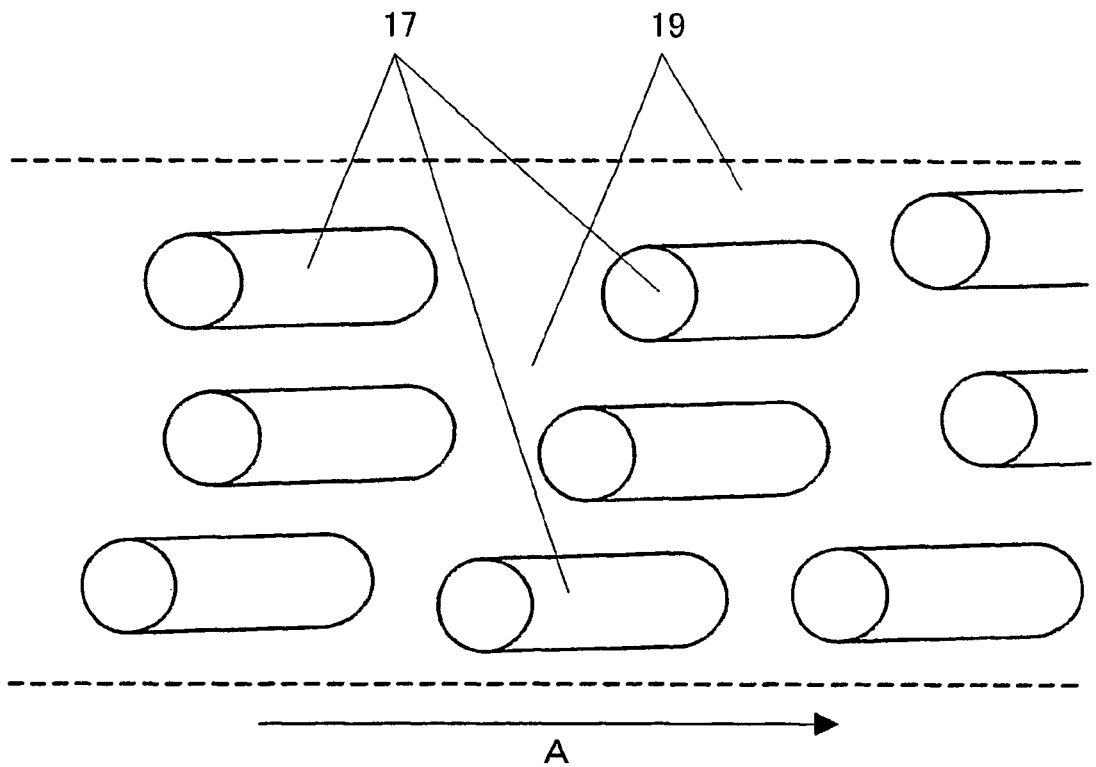
FIG. 7A is a top plan view conceptually illustrating the relationship between an organic semiconductor material and nanotubes in a semiconductor layer in a state just after application of a composite material in a fabrication process of the TFT according to the third embodiment.
Figure 7B:
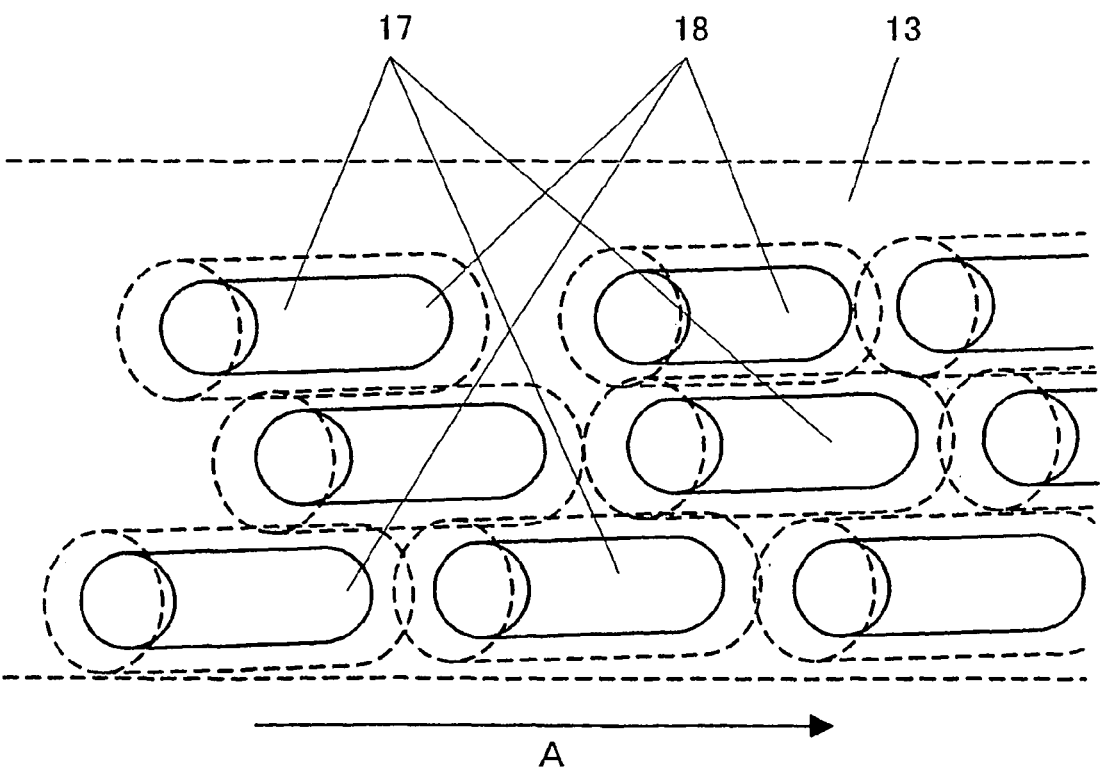
FIG. 7B is a top plan view conceptually illustrating the relationship between the organic semiconductor material and the nanotubes in the semiconductor layer in a state where the carbon nanotubes are precipitated from the state shown in FIG. 7A.

FIG. 7A is a top plan view conceptually illustrating the relationship between the organic semiconductor material and the nanotubes in the semiconductor layer 13 in a state just after application of the solution of the composite material onto the surface of the substrate 2 in the semiconductor layer forming step. FIG. 7B is a top plan view conceptually illustrating the relationship between the organic semiconductor material and the nanotubes in the semiconductor layer 13 in a state where the composite material applied is concentrated to precipitate the semiconductor-type carbon nanotubes coated with the organic semiconductor material. As shown in FIG. 7A, the carbon nanotubes 17 in the composite material solution 19 are individually positioned as physically oriented substantially in a direction (indicated by arrow A) in which the surface of the substrate (not shown) has been orientation-treated. The principle of this orientation is apparent from the liquid crystal orientation technique. When the composite material solution 19 is concentrated in this condition, the carbon nanotubes 17 are precipitated in a favorably oriented condition on the substrate (not shown) with their respective circumferences coated with the polymer-type organic semiconductor material 18. The direction of orientation is selected so that desired electrical characteristics can be obtained relative to the line interlinking the source electrode and the drain electrode (not shown). For example, if the direction of orientation of the carbon nanotubes is parallel with the line interlinking the source electrode and the drain electrode, the on-characteristics are improved.

In cases where a liquid crystalline polymer-type semiconductor material is used as the organic semiconductor material, the orientation treatment makes it possible to align polymer-type organic semiconductor molecules and arrange the nanotubes more favorably. By arranging the nanotubes side by side, the semiconductor layer 13 can be formed which has a high fill factor without clearance between adjacent nanotubes. Accordingly, it is possible to improve the dispersion density, hence, form a TFT having a high carrier mobility. The nanotubes arranged side by side also provide the advantage of allowing electrons to flow smoothly, which contributes to an improvement in carrier mobility.

Fourth Embodiment

The fourth embodiment is directed to a TFT having a semiconductor layer formed from a composite material comprising an organic semiconductor material and nanotubes. These nanotubes include series of plural nanotubes joined with each other.

Figure 8:
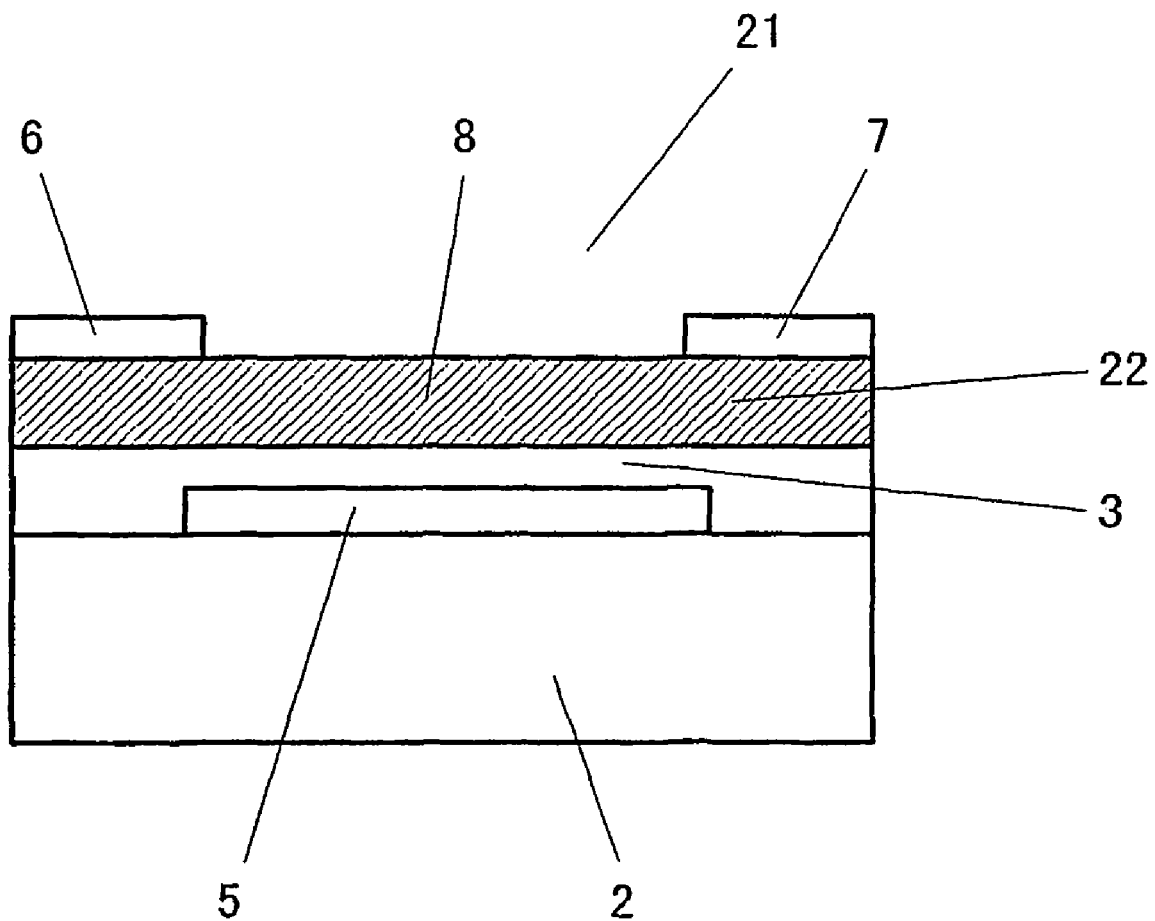
FIG. 8 is a sectional view schematically showing the construction of a TFT according to a fourth embodiment.

FIG. 8 is a sectional view schematically showing the construction of the TFT according to this embodiment. As shown in FIG. 8, the TFT 21 has the same construction as in the first embodiment shown in FIG. 1 except the semiconductor layer 22. For this reason, description will be omitted of the features other than the step of forming the semiconductor layer 22.

In the fourth embodiment, the semiconductor layer 22 is formed from the composite material comprising the organic semiconductor material and the nanotubes including series of plural nanotubes joined with each other.

More specifically, the composite material comprises carbon nanotubes of a high carrier mobility including series of carbon nanotubes each having an end portion joined with an end portion of adjacent one by chemical bond such as covalent bond, and the polymer-type organic semiconductor material comprising a fluorene-bithiophene copolymer. The number of joined carbon nanotubes is two, or three or more without limitation.

Figure 9:
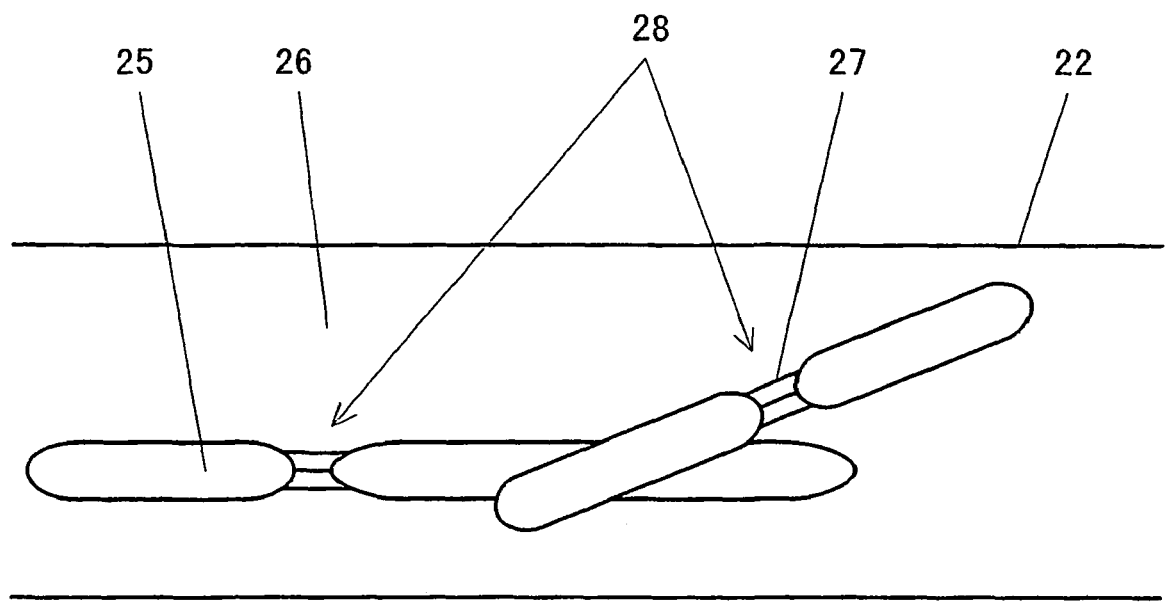
FIG. 9 is a top plan view conceptually illustrating the relationship between an organic semiconductor material and nanotubes in a semiconductor layer of the TFT according to the fourth embodiment.

FIG. 9 is a top plan view conceptually illustrating the relationship between the organic semiconductor material and the nanotubes in the semiconductor layer 22 of the TFT according to the present embodiment. In the composite material preparation step, the composite material is prepared which comprises a nanotube material including units of nanotubes 25 which are each joined with an adjacent one via a joint portion 27, and the organic semiconductor material 26.

For example, the nanotube material is previously provided which is obtained by chemically bonding nanotubes 25 to each other at least at end portions thereof by covalent bonding for example. A typical example of carbon nanotube unit is represented by the chemical formula 1:

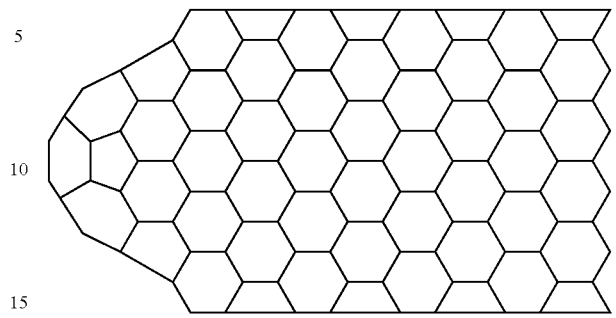

(Chemical Formula 1)

In order to chemically bond tip ends of respective nanotubes each consisting of five-membered rings and six-membered rings, bisulfone represented by chemical formula 2 is provided which is substituted with a bishexyloxy group.

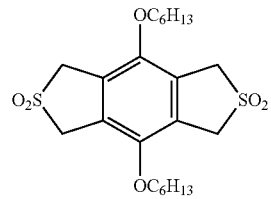

(Chemical Formula 2)

The compound of the chemical formula 2 and the nanotubes of the chemical formula 1 in equimolar amounts are refluxed over 1,2,4-trichlorobenzene solvent to cause reaction therebetween to proceed. After about 20 hours of reaction, a compound represented by chemical formula 3 is produced having carbon nanotubes joined with each other.

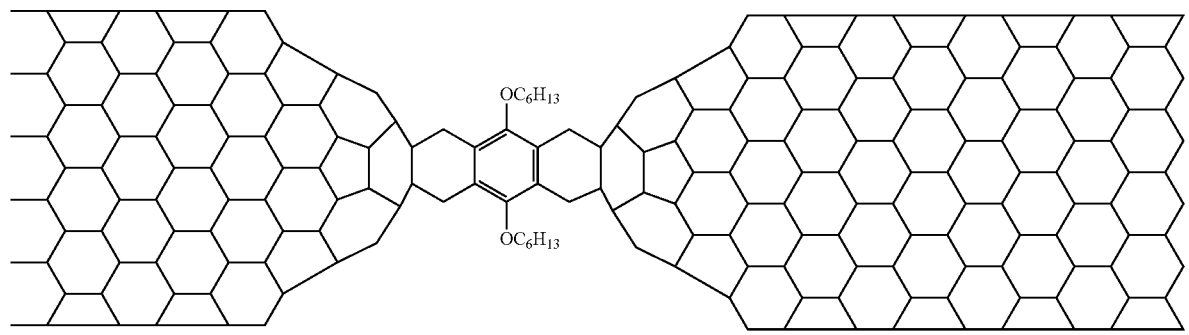

(Chemical Formula 3)

As shown in chemical formula 3, tip ends of respective carbon nanotubes are joined with each other via a bis-o-quinodimethane group. In this way, the nanotube material is prepared which comprises carbon nanotubes 25 joined with each other by covalent bond.

In the present embodiment, carbon nanotubes 10 each having a nanostructure shape with a length of 0.2 to 3 μm and a diameter of about 1.5 nm (not less than 1.4 nm) are joined with each other via a spacer serving as the joint portion 12 which covalent-bonds end portions of respective carbon nanotubes 10 with each other by the above-described synthesizing method.

In the semiconductor layer 22, at least the circumference of carbon nanotubes 25 joined with each other by the above-described synthesizing method, the joint portion 27 of the carbon nanotubes 25 and the circumference 28 of the joint portion 27 are coated with the polymer-type organic semiconductor material 26 comprising the fluorene-bithiophene copolymer which is amorphous and has a high mechanical strength, as shown in FIG. 9. That is, in the semiconductor layer 22 shown in FIG. 9, series of joined carbon nanotubes 25 of nanostructure are dispersed in the organic semiconductor material 26, while each series of joined nanotubes 25, the joint portion 27 thereof and the circumference 28 of the joint portion 27 are coated with the polymer-type organic semiconductor material 26 which is amorphous and has a high mechanical strength. As a result, the polymer-type organic semiconductor material, which is a flexible material, is filled between adjacent ones of multiple series of joined carbon nanotubes 25 favorably and hence can hold the entire layer flexibly.

When the TFT 21 is on, carriers propagating through each carbon nanotube 25 can be transmitted between carbon nanotubes 25 via organic semiconductor material 26 present around the circumference 28 of the joint portion 27 intervening the carbon nanotubes 25. That is, the organic semiconductor material 26 can compensate for a drop in carrier mobility by chemical bond at the joint portion 27 between carbon nanotubes 25 having high carrier mobility, thereby providing for a TFT having high carrier mobility. The carrier mobility at channel 8 of the TFT 21 was 210 cm$^2$/Vs, which proved that the TFT 21 had a high carrier mobility.

As described above, by using nanotubes 25 joined with each other in the composite material forming the semiconductor layer 22, it is possible to further increase the number of nanotubes 25 or the fill density of nanotubes 25 in the semiconductor layer 22, further increase the density of electric contacts between nanotubes 25 and further improve the carrier mobility. In addition, incorporation of nanotubes chemically bonded to each other in the semiconductor layer 22 makes it possible to enhance the mechanical strength of the semiconductor layer 22.

Also, by covering the carbon nanotubes 25 and at least the circumference 28 of the joint portion 27 between adjacent carbon nanotubes 25 with the organic semiconductor material 26, desirably with the polymer-type organic semiconductor material, the joint portion between adjacent carbon nanotubes, peripheral portions around the joint portion and like portions are covered with the polymer-type organic semiconductor material forming firm film and, hence, the TFT has a high mechanical strength with the carbon nanotubes firmly held in position.

When the TFT 22 is off, the carbon nanotubes 25 do not contact directly to each other since they are individually coated with the organic semiconductor material 26 circumferentially. For this reason, the off-characteristics of the TFT 21 are favorable.

Microscopically, a portion of the organic semiconductor material 26 that is present at a joint point of each nanotube 25 serves as a switch section. For this reason, the TFT that is subject to less variation in characteristics can be fabricated without the need to form an extremely fine pattern on the substrate with difficulty.

As in the first embodiment, various methods may be adopted in the composite material preparation step and the semiconductor layer forming step. However, the present embodiment is different from the first embodiment only in that nanotubes joined with each other are previously provided prior to the composite material preparation step and then used in the preparation of the composite material.

The above-described construction according to the invention of the instant application allows the number of carbon nanotubes placed and the density of electrical contacts between the nanotubes to be increased and hence can realize a thin film transistor having superior characteristics to a thin film transistor having a composite-type semiconductor layer composed of a mixture of an organic semiconductor material and nanotubes (NT) in which the nanotubes are dispersed by mixing.

Fifth Embodiment

The fifth embodiment is directed to a TFT having a semiconductor layer formed from a composite material comprising an organic semiconductor material and nanotubes. These nanotubes include series of plural nanotubes joined with each other.

Figure 10:
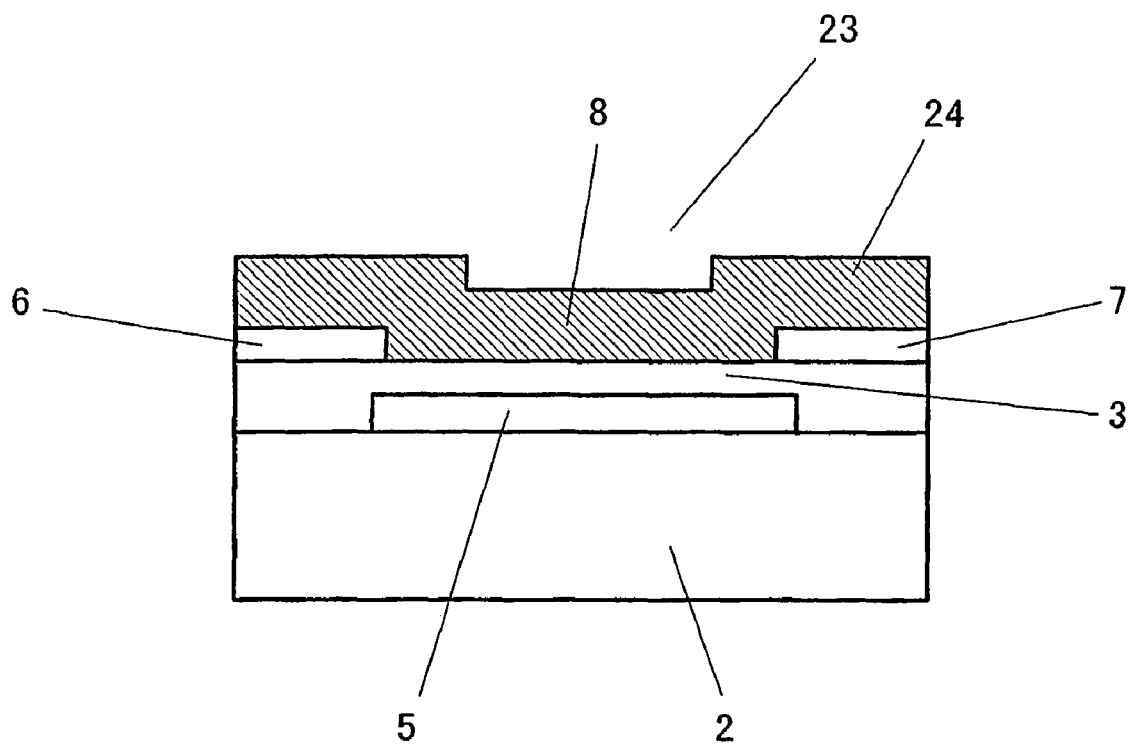
FIG. 10 is a sectional view schematically showing the construction of a TFT according to a fifth embodiment.

FIG. 10 is a sectional view schematically showing the construction of the TFT according to this embodiment. As shown in FIG. 10, the TFT 23 has the same construction as in the second embodiment shown in FIG. 2 except the semiconductor layer 24. For this reason, description will be omitted of the features other than the step of forming the semiconductor layer 24.

In the fifth embodiment, the semiconductor layer 24 is formed from the composite material comprising the organic semiconductor material and the nanotubes including series of plural nanotubes joined with each other.

The method of forming the semiconductor layer 24 includes a composite material preparation step in which the composite material is prepared by immersing carbon nonotubes including series of plural carbon nanotubes joined with each other into a solution of a polymer-type organic semiconductor material, and a semiconductor layer forming step in which the semiconductor layer 24 is formed on gate insulator 3 by a process including applying the composite material to the gate insulator 3 or spraying the composite material onto the gate insulator 3 by the ink-jet technique or a like technique and then concentrating or drying the composite material to precipitate the joined carbon nanotubes coated with the polymer-type organic semiconductor material.

Figure 11:
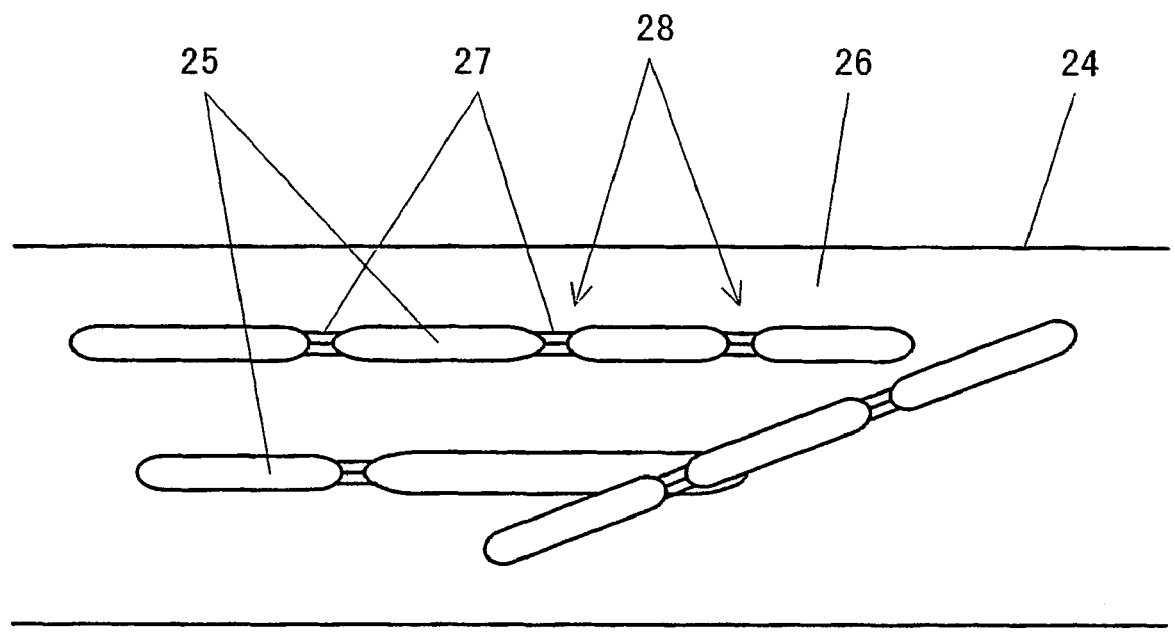
FIG. 11 is a top plan view conceptually illustrating the relationship between an organic semiconductor material and nanotubes in a semiconductor layer of the TFT according to the fifth embodiment.

FIG. 11 is a sectional view conceptually illustrating the relationship between the organic semiconductor material and the nanotubes in the semiconductor layer 24 of the TFT 23 according to the present embodiment. In forming the semiconductor layer 24, use is made of the composite material comprising the organic semiconductor material 26 which is a polymer-type organic semiconductor material comprising a fluorene-bithiophene copolymer, and a nanotube material including series of plural carbon nanotubes 25 joined with each other which is prepared by the synthesizing method to be described below. The following is the method of synthesizing the nanotube material by joining plural nanotubes 25 with each other by chemical bonding at least end portions thereof.

A (trimethylsilyl)ethynyl derivative of carbon nanotube represented by chemical formula 4 is desilylated in THF using fluoride ions to give a dispersion of a nanotube derivative represented by chemical formula 5. When the reaction proceeds to produce a sufficient amount of the alkyl derivative compound of nanotube represented by chemical formula 5, the reaction is stopped using trifluoroacetic acid.

(Chemical Formula 4)
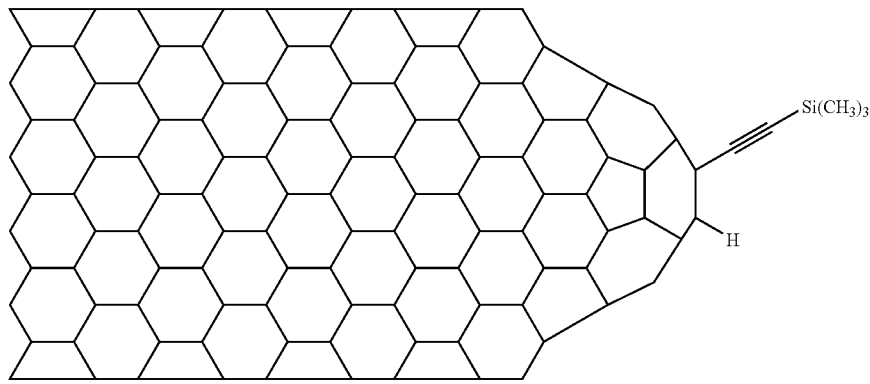
(Chemical Formula 5)
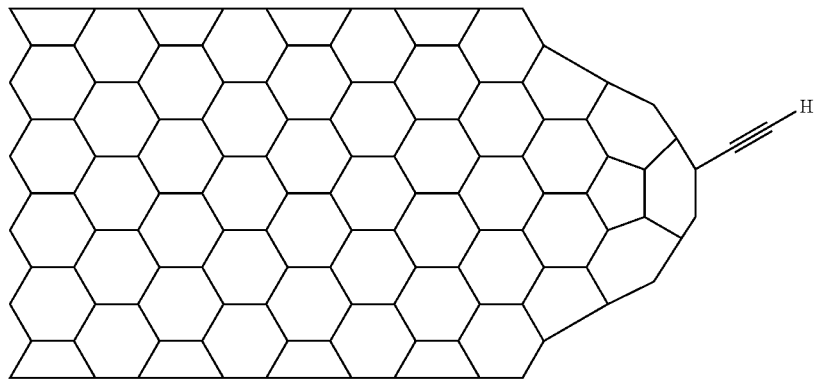
The compound of the chemical formula 5 thus produced is subjected to oxidative coupling in chlorobenzene using CuCl and TMEDA in room-temperature air for six hours, to synthesize a compound represented by chemical formula 6 which comprises series of plural carbon nanotubes joined with each other.
(Chemical Formula 6)
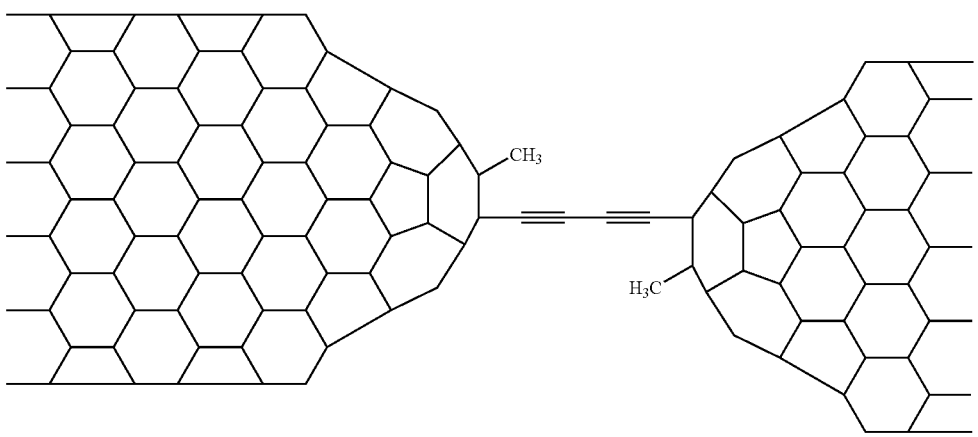

-continued

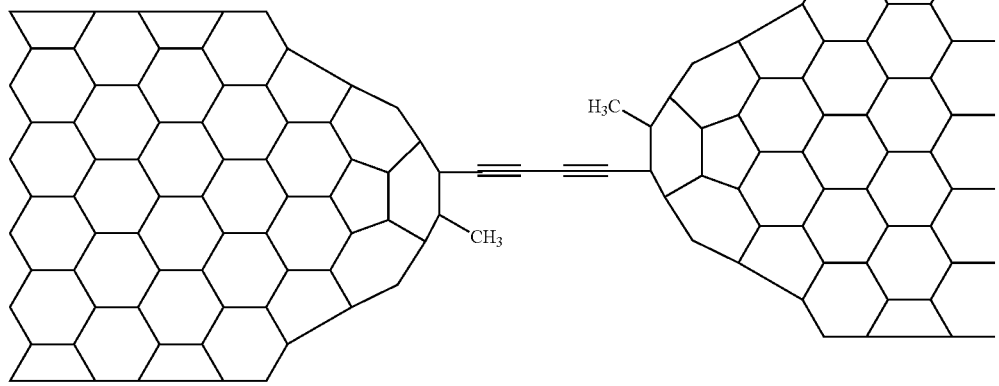

Semiconductor layer 16 as shown in FIG. 11 was formed comprising the polymer-type organic semiconductor material 26 and the nanotube material comprising series of carbon nanotubes 25 joined with each other by covalent-bonding two to four carbon nanotubes to each other according the above-described synthesizing method, each of the carbon nanotubes having a nanostructure with a length of 0.2 to 3 µm and a diameter of about 1.5 nm (not more than 1.4 nm). By using the carbon nanotubes including series of plural carbon nanotubes 25 having a high carrier mobility and joined with each other, it is possible to position the carbon nanotubes more closely to each other, increase the number of electrical contacts which permit carriers to travel through the organic semiconductor 26 at joint portions 27 of carbon nanotubes, and thereby to impart the semiconductor layer 24 with a higher carrier mobility.

TFT 23 was fabricated having composite-type semiconductor layer 24 composed of a thiophene polymer-type organic semiconductor material 26 having a low carrier mobility of about 0.003 to 0.02 $cm^2/Vs$ and carbon nanotubes including series of plural carbon nanotubes 25 joined with each other, each of the carbon nanotubes 25 having a high carrier mobility of about 1000 to 1500 $cm^2/Vs$. The value of carrier mobility at channel 8 of the TFT 23 was 240 $cm^2/Vs$. Thus, the TFT 23 obtained had a high carrier mobility and superior characteristics.

In the composite material preparation step, polymer-type organic semiconductor film having a high mechanical strength is formed to coat the circumferential surfaces of the carbon nanotubes including series of plural nanostructured carbon nanotubes joined with each other. In the semiconductor layer forming step, the composite material thus prepared is concentrated to precipitate carbon nanotubes, so that the series of plural carbon nanotubes coated with the polymer-type organic semiconductor film are piled up to form the semiconductor layer 24. Since the polymer-type organic semiconductor material is a flexible film material, the polymer-type organic material holds joined carbon nanotubes with a satisfactory fill factor and allows carriers to propagate through the joint portions. For this reason, a TFT having improved mechanical strength and characteristics can be fabricated easily.

It is possible that the composite material preparation step is the step of preparing a solution of the composite material in which the aforementioned joined nanotubes are dispersed while the semiconductor layer forming step is the step of spraying and drying the solution of the composite material.

When the TFT 23 is on, current in the semiconductor layer 24 mostly passes through the nanotubes 25 and passes across nanotubes 25 joined with each other as closely spaced a short distance from each other through the polymer-type organic semiconductor material 26 coating the circumferences of the nanotubes 25. Also, by using nanotubes joined with each other by bonding, the frequency with which nanotubes are positioned close to each other in the semiconductor layer 24 is improved as compared with the case where nanotubes are not joined with each other. Therefore, the TFT 23 has a higher carrier mobility and more excellent on-characteristics than a TFT having the semiconductor layer comprising the polymer-type organic semiconductor material only or unjoined nanotubes dispersed in the polymer-type organic semiconductor material.

Further, the TFT 23 is superior in off-characteristics to a TFT having semiconductor layer 24 comprising only nanotubes since the semiconductor layer 24 is composed of joined nanotubes 25 and the polymer-type organic semiconductor material 26 coating the circumferences of the joined nanotubes 25.

In the description of the fourth and fifth embodiments, an example of a synthesizing method based on covalent bonding is used as the method of bonding nanotubes to each other. However, other synthesizing methods can be used to practice the invention similarly.

The semiconductor layer of the TFT according to each of the fourth and fifth embodiments comprises at least joined nanotubes. The amount of such joined nanotubes is suitably 20 to 100% of the total amount of nanotubes. Preferably, the amount of joined nanotubes is 50 to 100% of the total amount of nanotubes. As the amount of joined nanotubes contained in the semiconductor layer increases, the density of nanotube joints in the semiconductor layer increases and, hence, the characteristics of the TFT become more improved.

Each of the fourth and fifth embodiments uses nanotubes each shaped to fall within the ranges: a length ranging from 0.2 to 3 µm and a diameter of not less than 1 nm, preferably not less than 1.4 nm. However, there is no limitation to these ranges. Also, nanotubes which can be used as the aforementioned nanotubes may be either mixed-type nanotubes including metal-type nanotubes and semiconductor-type nanotubes or nanotubes of the semiconductor type not including any metal-type nanotube. Preferably, the nanotubes include semiconductor-type nanotubes in a larger amount than the metal-type nanotubes. More preferably, the nanotubes consist only of semiconductor-type nanotubes.

While the nanotubes used are carbon nanotubes according to the foregoing description, it will be possible in future to use nanotubes formed from a material other than carbon.

The TFT according to any one of the above-described first to fifth embodiments can be used in a semiconductor circuit device, portable equipment or disposable device employing such a semiconductor circuit device, or other electronic devices.

Sixth Embodiment

This embodiment is directed to a sheet-like flexible display, a wireless ID tag and a mobile phone as applications of the TFTs according to the first to fifth embodiments.

First, description will be made of an active-matrix display constructed as the flexible display.

Figure 12:
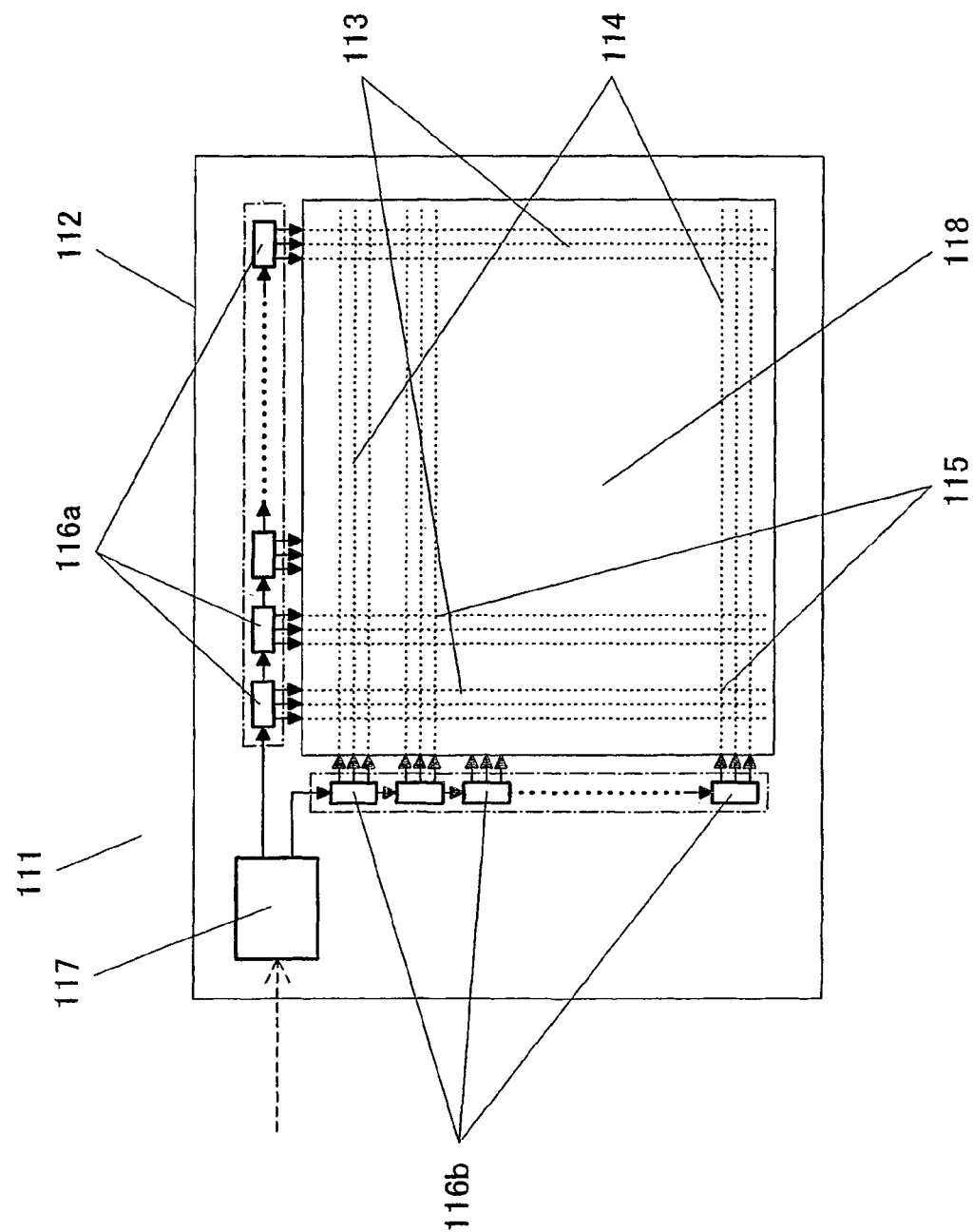
FIG. 12 is a sectional view schematically showing the construction of an active-matrix display according to a sixth embodiment.

FIG. 12 is a sectional view schematically showing the construction of the active-matrix display according to the present embodiment. As shown in FIG. 12, the active-matrix display 111 according to the present embodiment has plural electrodes 113 and 114 arranged in a matrix configuration on a plastic substrate 112. On each of points of intersection of the electrodes 113 and 114 is disposed a TFT (not shown) according to any one of the first to fifth embodiments which functions as a switching device for a respective one of pixels. The TFT according to any one of the first to fifth embodiments which serves as the switching device for the respective one of the pixels is capable of turning ON/OFF an information signal based on its favorable characteristics and hence can provide for a highly reliable rewritable active-matrix display. A display panel 118 is laid over the TFTs. The active-matrix display 111 further includes driving circuits 116a and 116b for driving the TFTs on the points of intersection via the electrodes 113 and 114, and a control circuit 117 for controlling the driving circuits 116a and 116b. Each of the driving circuits 116a and 116b and control circuit 117 can be constructed of a semiconductor circuit provided with a TFT according to any one of the first to fifth embodiments. Such a construction makes it possible to integrate the display panel 118, driving circuits 116a and 116b and control circuit 117 and hence provide for a sheet display that is excellent in mechanical flexibility and impact resistance.

A sheet-like or paper-like display can be constructed as an active-matrix display. The display panel used in such a display can employ display panel types including the liquid crystal display type, electrophoretic display type, organic EL type, electrochromic display type (ECD), electrolytic deposition type, electronic particulate material type, and coherent modulation type (MEMS).

Figure 13:
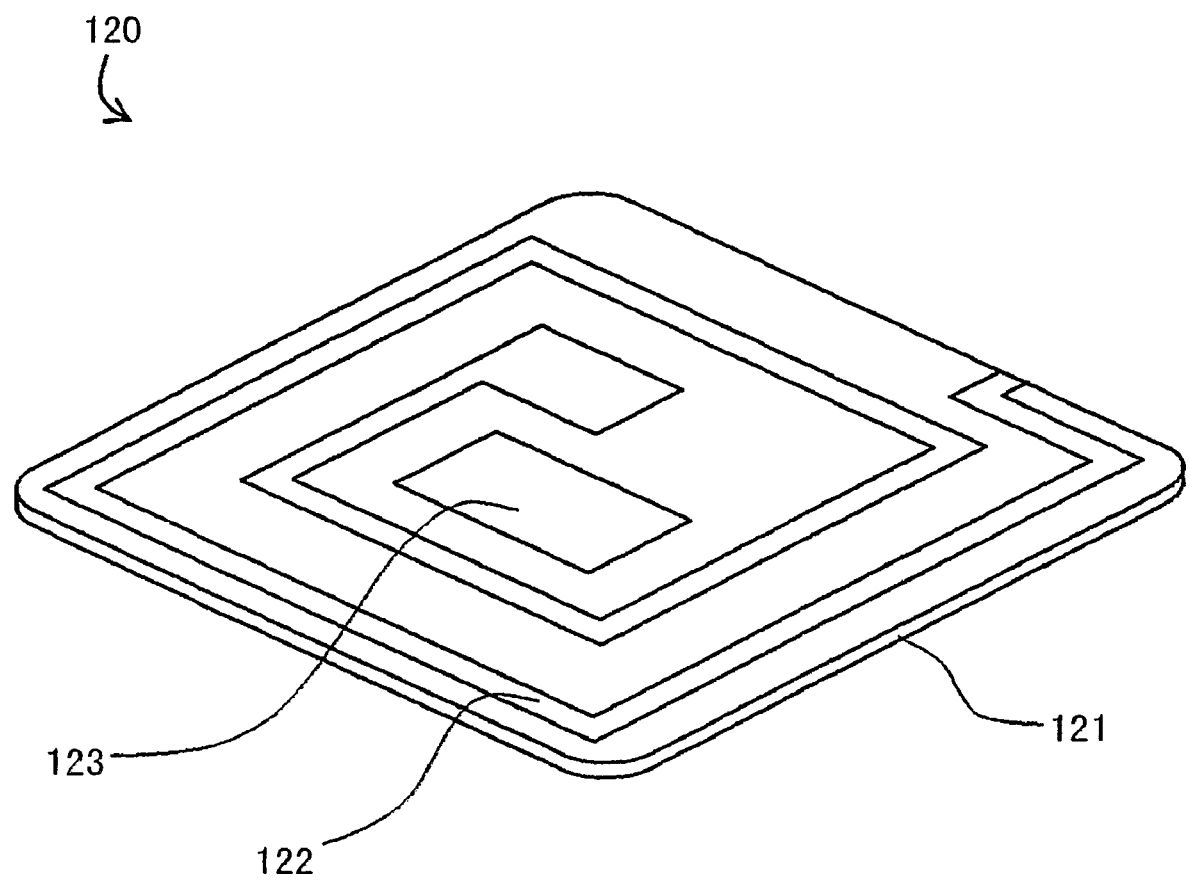
FIG. 13 is a perspective view schematically showing the construction of a wireless ID tag using a TFT according to the sixth embodiment.

Next, description will be made of an application of a TFT according to the present invention to a wireless ID tag. FIG. 13 is a perspective view schematically showing the construction of a wireless ID tag employing a TFT according to this embodiment.

As shown in FIG. 13, the wireless ID tag 120 according to the present embodiment uses a plastic substrate 121 in the form of film as a base. An antenna section 122 and a memory IC section 123 are provided on the substrate 121. Here, the memory IC section 123 can be formed using a TFT according to any one of the first to fifth embodiments. By imparting the wireless ID tag 120 with adhesion on the reverse side thereof, it is possible to use the ID tag 120 as affixed to a non-flat article such as a candy pouch or drink can. The wireless ID tag 120 is optionally provided on the obverse side thereof with a protective film when necessary.

Thus, the use of a TFT according to any one of the first to fifth embodiments makes it possible to realize a flexible and less-damageable wireless ID tag which can be affixed to articles of various shapes or materials. Further, it becomes possible to realize a wireless ID tag of increased response speed (processing speed).

The advantage of the present invention is not limited on the construction of the wireless ID tag shown in FIG. 13. Therefore, the antenna section and the memory IC section can be arranged or constructed as desired. Also, the wireless IC tag may incorporate a logic circuit for example. Though the antenna section 122 and the memory IC section 123 are previously formed on the plastic substrate 121 in the present embodiment, the present invention is not limited to this feature. It is possible to form the wireless ID tag directly on an object by utilizing a method like ink-jet printing. In this case also, the use of the construction of the TFT according to the present invention makes it possible to fabricate a high-performance wireless ID tag that is excellent in mechanical flexibility and impact resistance.

Figure 14:
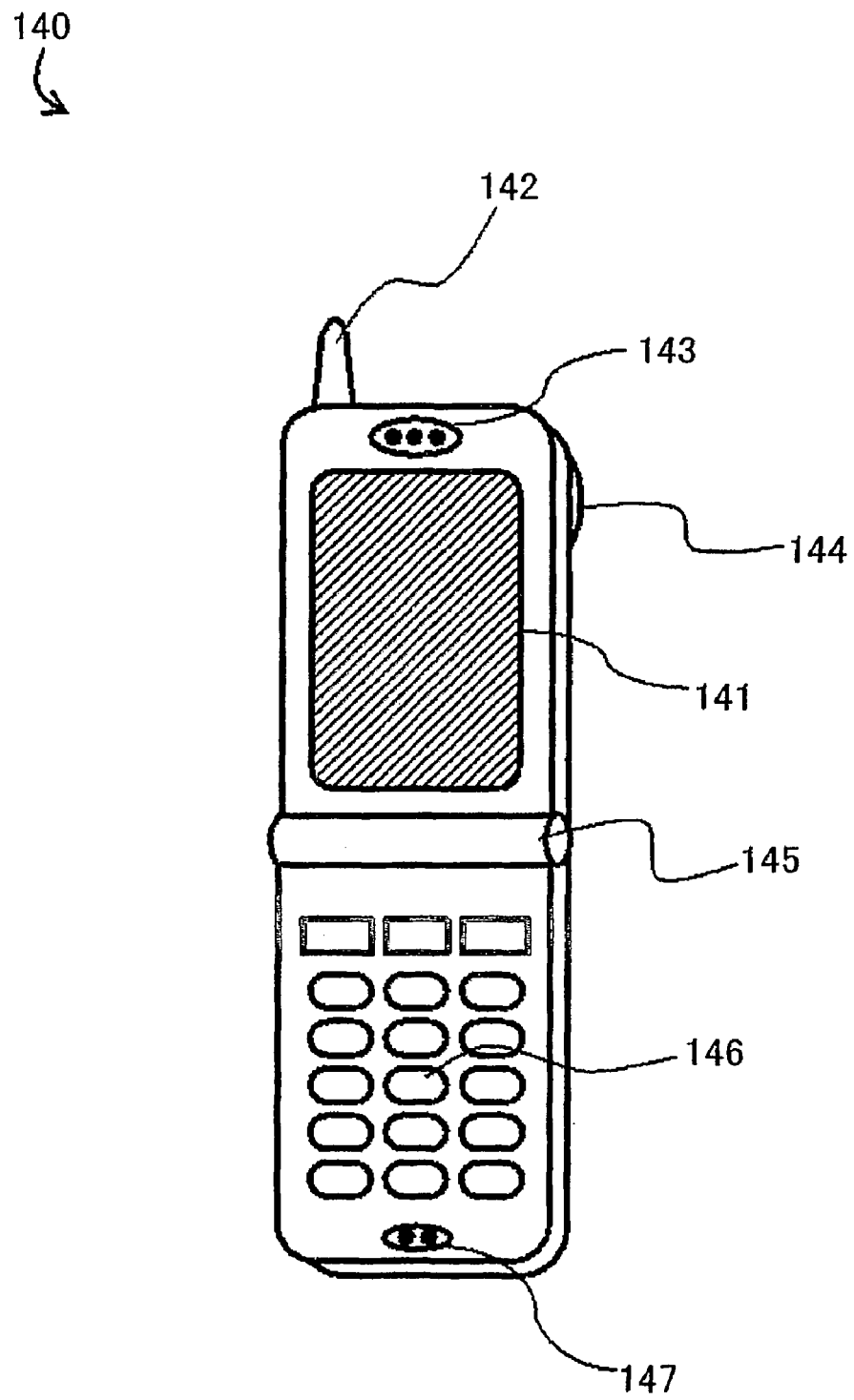
FIG. 14 is a front elevational view schematically showing the construction of a mobile phone using the TFT according to the sixth embodiment.
Figure 15:
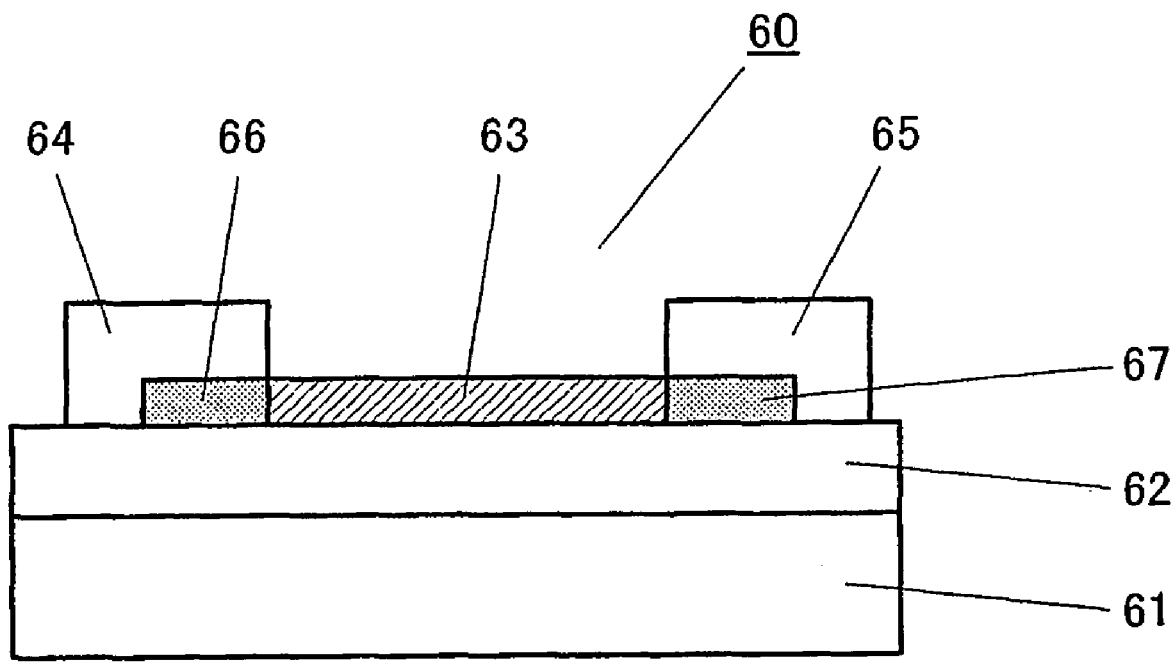
FIG. 15 is a sectional view schematically showing the construction of a conventional TFT having a semiconductor layer comprising carbon nanotubes.

Next, description will be made of an application of a TFT according to the present invention to a mobile phone as an example of application to portable equipment. FIG. 14 is a front elevational view schematically showing the construction of a mobile phone employing a TFT according to this embodiment.

As shown in FIG. 14, the mobile phone 140 according to the present embodiment includes: a display section 141 comprising a liquid crystal display device or the like for displaying a phone number and the like; a transmitting/receiving section 142 capable of transmitting and receiving communication radio wave, the transmitting/receiving section 142 comprising a whip antenna which can be retracted into the phone body; a voice output section 143 comprising a speaker or the like for outputting communicative voice; a camera section 144 having a CCD or the like capable of photographing; a collapsing movement section 145 for collapsing the mobile phone 140 when necessary; plural operation switches 146 for inputting a phone number or letters; and a voice input section 147 comprising a capacitor microphone or the like for inputting communicative voice.

Though not particularly shown in FIG. 14, the mobile phone 140 has an integrated circuit such as an ID or an LSI therein. The integrated circuit employing the TFT of the present invention is appropriately used as a component of the mobile phone 140, such as a computing device, storage device, switching device or the like. The mobile phone 140 thus constructed functions as a portable communication terminal.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

INDUSTRIAL APPLICABILITY

The present invention is useful as a TFT having a high carrier mobility and excellent mechanical flexibility and impact resistance and as a method of fabricating the same. Also, the TFT according to the present invention is useful in manufacturing a sheet-like or paper-like active matrix display, a wireless ID tag, portable equipment such as a mobile phone, and the like.

LIST OF REFERENCE NUMERALS 1,15,20,21,23 . . . thin film transistor
2 . . . substrate
3 . . . gate insulator
4,13,16,22,24 . . . semiconductor layer
5 . . . gate electrode
6 . . . source electrode
7 . . . drain electrode
8 . . . channel
10,17,25 . . . carbon nanotubes
11,18,26 . . . organic semiconductor material
27 . . . joint portion
111 . . . active-matrix display
112 . . . plastic substrate
113,114 . . . electrodes
115 . . . points of intersection
116a,116b . . . driving circuits
117 . . . control circuit
118 . . . display panel
120 . . . wireless ID tag
121 . . . plastic substrate
122 . . . antenna section
123 . . . memory IC section
140 . . . mobile phone
141 . . . display section
142 . . . transmitting/receiving section
143 . . . voice output section
144 . . . camera section
145 . . . collapsing movement section
146 . . . operation switch
147 . . . voice input section

The invention claimed is:

1. A field effect transistor comprising: a semiconductor layer through which carriers injected from a source region travel toward a drain region, the semiconductor layer being formed from a composite material comprising an organic semiconductor material and nanotubes, wherein plural ones of the nanotubes are chemically joined with each other in the semiconductor layer.

2. The field effect transistor according to claim 1, wherein the plural ones of the nanotubes are chemically joined by a connecting material and a joint portion between the joined nanotubes including the connecting material is coated with the organic semiconductor material in the semiconductor layer.

3. The field effect transistor according to claim 1, wherein the nanotubes are carbon nanotubes.

4. The field effect transistor according to claim 1, wherein the organic semiconductor material is a polymer-type organic semiconductor material.

5. The field effect transistor according to claim 4, wherein the polymer-type organic semiconductor material is a thiophene-type material.

6. The field effect transistor according to claim 1, wherein the organic semiconductor material is a low-molecular-weight organic semiconductor material.

7. The field effect transistor according to claim 6, wherein the low-molecular-weight organic semiconductor material is an acene-type material.

8. The field effect transistor according to claim 1, which is formed on a substrate.

9. The field effect transistor according to claim 8, wherein the substrate is a plastic sheet or a resin film.

10. An active-matrix display comprising a plurality of field effect transistors as recited in claim 1 which are disposed as switching devices for driving pixels.

11. A wireless ID tag comprising a field effect transistor as recited in claim 1 which is used as a semiconductor device for forming an integrated circuit.

12. Portable equipment comprising a field effect transistor as recited in claim 1 which is used as a semiconductor device for forming an integrated circuit.

13. The field effect transistor according to claim 1, wherein the plural ones of the nanotubes are chemically joined at an end of each nanotube.

* * * * *